(12) United States Patent
Hazani et al.

(10) Patent No.: US 8,391,470 B2
(45) Date of Patent: Mar. 5, 2013

(54) DEVICE, METHOD AND SYSTEM FOR ESTIMATING THE TERMINATION TO A WIRED TRANSMISSION-LINE BASED ON DETERMINATION OF CHARACTERISTIC IMPEDANCE

(75) Inventors: Ami Hazani, Ra'anana (IL); Yehuda Binder, Hod Hasharon (IL)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 791 days.

(21) Appl. No.: 12/141,600

(22) Filed: Jun. 18, 2008

(65) Prior Publication Data

US 2008/0284451 A1 Nov. 20, 2008

Related U.S. Application Data

(62) Division of application No. 11/091,371, filed on Mar. 29, 2005, now Pat. No. 7,521,943.

(30) Foreign Application Priority Data

Jan. 23, 2005 (IL) .......................................... 166445

(51) Int. Cl.
*H04M 1/00* (2006.01)
*H04M 9/00* (2006.01)
(52) U.S. Cl. ....................................................... 379/404
(58) Field of Classification Search ............... 379/21, 379/30, 404; 324/691, 713, 714
See application file for complete search history.

(56) References Cited

U.S. PATENT DOCUMENTS

| | | | |
|---|---|---|---|
| 3,576,492 A * | 4/1971 | Rao | .............................. 324/106 |
| 5,010,399 A | 4/1991 | Goodman et al. | |
| 5,193,108 A | 3/1993 | Stocklin | |
| 5,541,543 A * | 7/1996 | Arnaud | .......................... 327/175 |
| 5,621,455 A | 4/1997 | Rogers et al. | |
| 5,633,801 A | 5/1997 | Bottman | |
| 5,734,658 A | 3/1998 | Rall et al. | |
| 5,841,360 A | 11/1998 | Binder | |
| 5,887,051 A * | 3/1999 | Sullivan et al. | ................. 379/21 |
| 5,896,443 A | 4/1999 | Dichter | |
| 6,069,899 A | 5/2000 | Foley | |
| 6,108,331 A | 8/2000 | Thompson | |
| 6,216,160 B1 | 4/2001 | Dichter | |
| 6,243,571 B1 | 6/2001 | Bullock et al. | |

(Continued)

FOREIGN PATENT DOCUMENTS

| | | |
|---|---|---|
| EP | 0 768 537 A1 | 4/1997 |
| WO | WO 02/25920 A1 | 3/2002 |

(Continued)

OTHER PUBLICATIONS

Strassberg, Dan; "Home Automation Buses: Protocols Really Hit Home"; EDN Design Feature, Apr. 13, 1995 (9 pages).

(Continued)

*Primary Examiner* — Alexander Jamal
(74) *Attorney, Agent, or Firm* — Browdy and Neimark, PLLC

(57) ABSTRACT

A system and method for measuring a characteristic impedance of a transmission-line comprises transmitting energy to the line, and shortly after measuring the voltage/current involved and thus measuring the equivalent impedance. The measured characteristic impedance may then be used in order to determine the termination value required to minimize reflections. In another embodiment, the proper termination is set or measured by adjusting the termination value to achieve maximum power dissipation in the terminating device. The equivalent characteristic impedance measurement may be used to count the number of metallic conductors connected to a single connection point. This abstract is not intended to limit or construe the scope of the claims.

22 Claims, 17 Drawing Sheets

U.S. PATENT DOCUMENTS

| | | | |
|---|---|---|---|
| 6,351,533 | B1 | 2/2002 | Parrott |
| 6,396,391 | B1 | 5/2002 | Binder |
| 6,480,510 | B1 | 11/2002 | Binder |
| 6,549,616 | B1 | 4/2003 | Binder |
| 6,560,319 | B1 | 5/2003 | Binder |
| 6,625,005 | B2 | 9/2003 | Otsuka et al. |
| 6,690,677 | B1 | 2/2004 | Binder |
| 6,820,225 | B1 * | 11/2004 | Johnson et al. ............... 714/715 |
| 6,842,459 | B1 | 1/2005 | Binder |
| 6,927,340 | B1 | 8/2005 | Binder |
| 6,937,056 | B2 | 8/2005 | Binder |
| 6,956,826 | B1 | 10/2005 | Binder |
| 7,106,721 | B1 | 9/2006 | Binder |
| 7,317,793 | B2 | 1/2008 | Binder |
| 7,656,807 | B2 * | 2/2010 | Chang et al. ................. 370/241 |
| 2001/0043673 | A1 * | 11/2001 | Gershon ..................... 379/22.02 |
| 2002/0019966 | A1 | 2/2002 | Yagil et al. |
| 2002/0039388 | A1 | 4/2002 | Smart et al. |
| 2002/0060617 | A1 | 5/2002 | Walbeck et al. |
| 2002/0146207 | A1 | 10/2002 | Chu |
| 2002/0166124 | A1 | 11/2002 | Gurantz et al. |
| 2002/0194383 | A1 | 12/2002 | Cohen et al. |
| 2003/0062990 | A1 | 4/2003 | Schaeffer, Jr. et al. |
| 2003/0099228 | A1 | 5/2003 | Alcock |
| 2003/0112965 | A1 | 6/2003 | McNamara et al. |
| 2003/0139151 | A1 | 7/2003 | Lifshitz et al. |
| 2004/0125819 | A1 | 7/2004 | Binder |
| 2005/0010954 | A1 | 1/2005 | Binder |
| 2005/0025162 | A1 | 2/2005 | Binder |
| 2005/0047431 | A1 | 3/2005 | Binder |
| 2005/0129069 | A1 | 6/2005 | Binder |
| 2005/0180561 | A1 | 8/2005 | Binder |
| 2005/0249245 | A1 | 11/2005 | Binder |
| 2005/0285621 | A1 * | 12/2005 | Chen et al. ...................... 326/30 |

FOREIGN PATENT DOCUMENTS

| | | |
|---|---|---|
| WO | WO 02/065229 A2 | 8/2002 |
| WO | WO 2004/001034 A2 | 12/2003 |

OTHER PUBLICATIONS

Hachman, Mark; "Compaq to Ride the CEBus"; EBN Jan. 22, 1996 (1 page).

IS-60.04; Node Communications Protocol Part 6: Application Layer Specification; Revision Apr. 18, 1996 (129 pages).

Markwalter, Brain et al; "CEBus Router Testing"; IEEE Transactions on Consumer Electronics Nov. 1991, vol. 37 No. 4 (8 pages).

Grayson Evans, The CEBUs Standard User's Guide, 1st edition, May 1996, 317 pages.

J. Hofmann, Cable, Television, and the Consumer Electronic Bus, Symposium Record, 15th International TV Symposium, Jun. 11, 1987, Montreux, Switzerland.

Fowler, Bill, "Transmission Line Characteristics", National Semiconductor Application Note 108, National Semiconductor Corporation, Jul. 1986, pp. 1-8.

True, Kenneth M., "Reflections: Computations and Waveforms", National Semiconductor Application Note 807, National Semiconductor Corporation, Mar. 1992, pp. 1-25.

True, Kenneth M., "Long Transmission Lines and Data Signal Quality", National Semiconductor Application Note 808, National Semiconductor Corporation, Mar. 1992, pp. 1-23.

True, Kenneth M., "Data Transmission Lines and Their Characteristics", National Semiconductor Application Note 806, National Semiconductor Corporation, Apr. 1992, pp. 1-7.

Vo, Joe, "A comparison of Differential Termination Techniques", National Semiconductor Application Note 903, National Semiconductor Corporation, Aug. 1993, pp. 1-10.

* cited by examiner

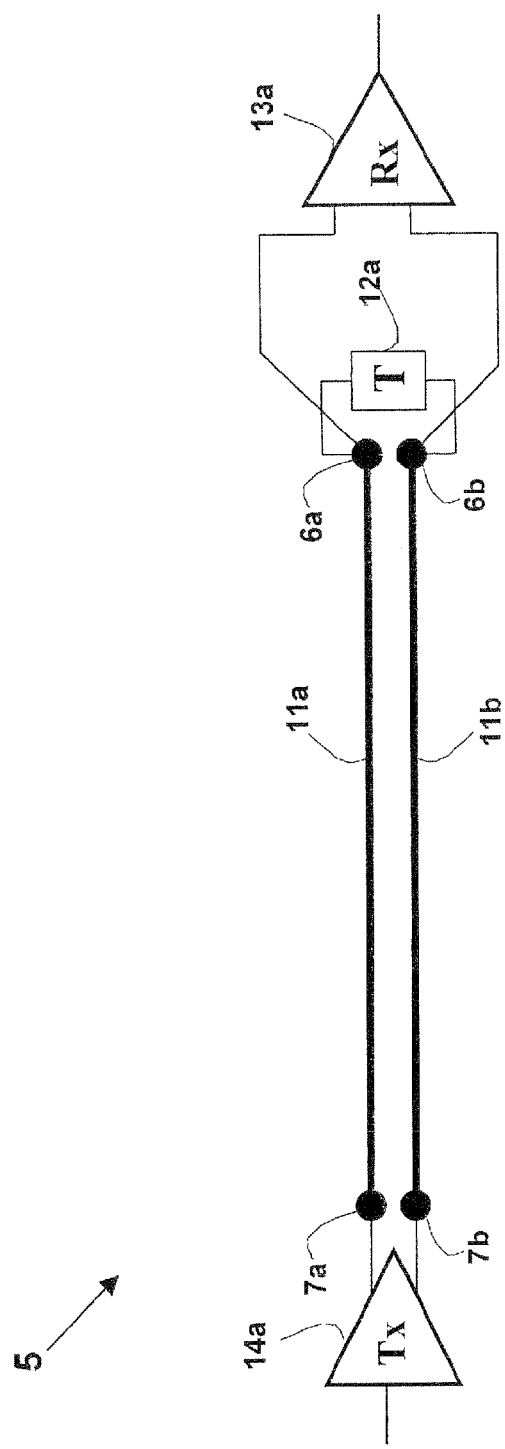
Figure 1 (Prior-Art)

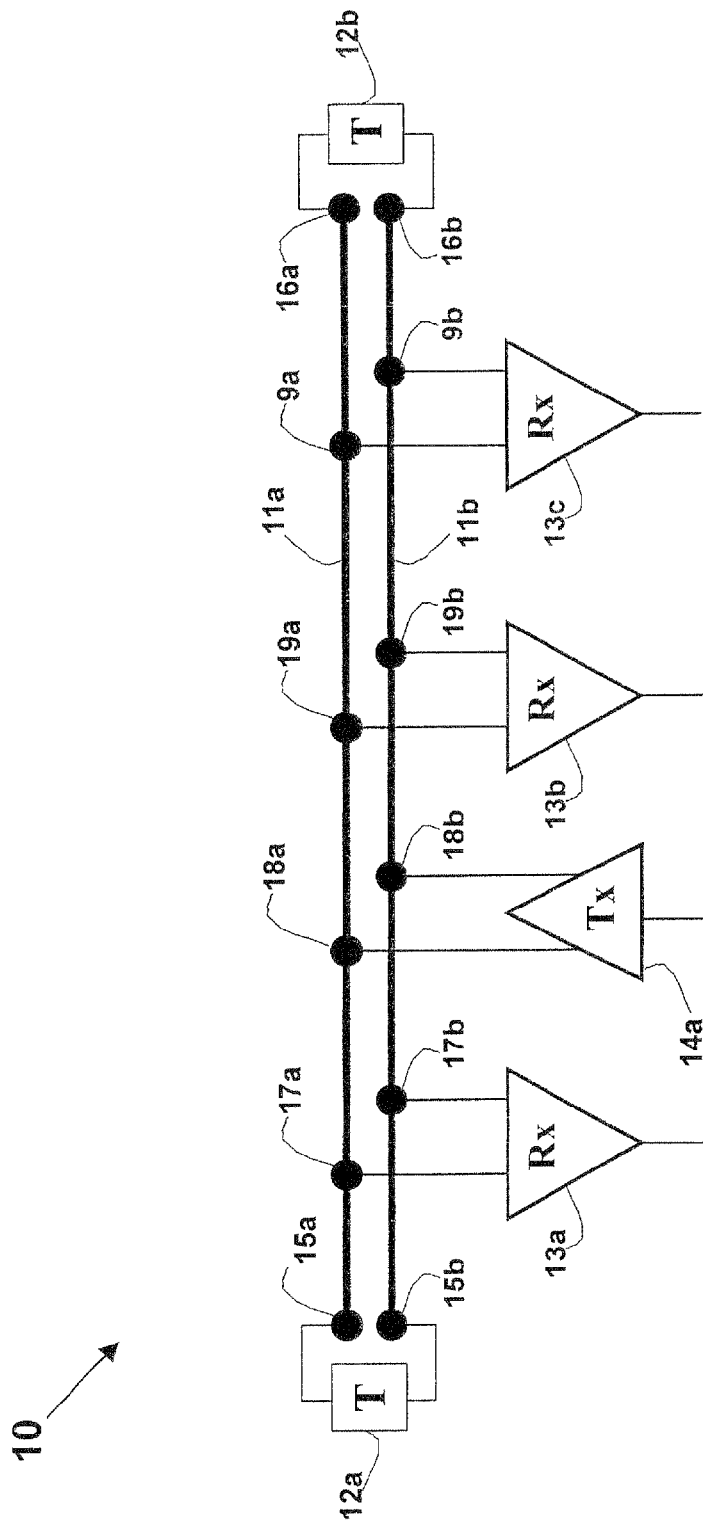
Figure 1a (Prior-Art)

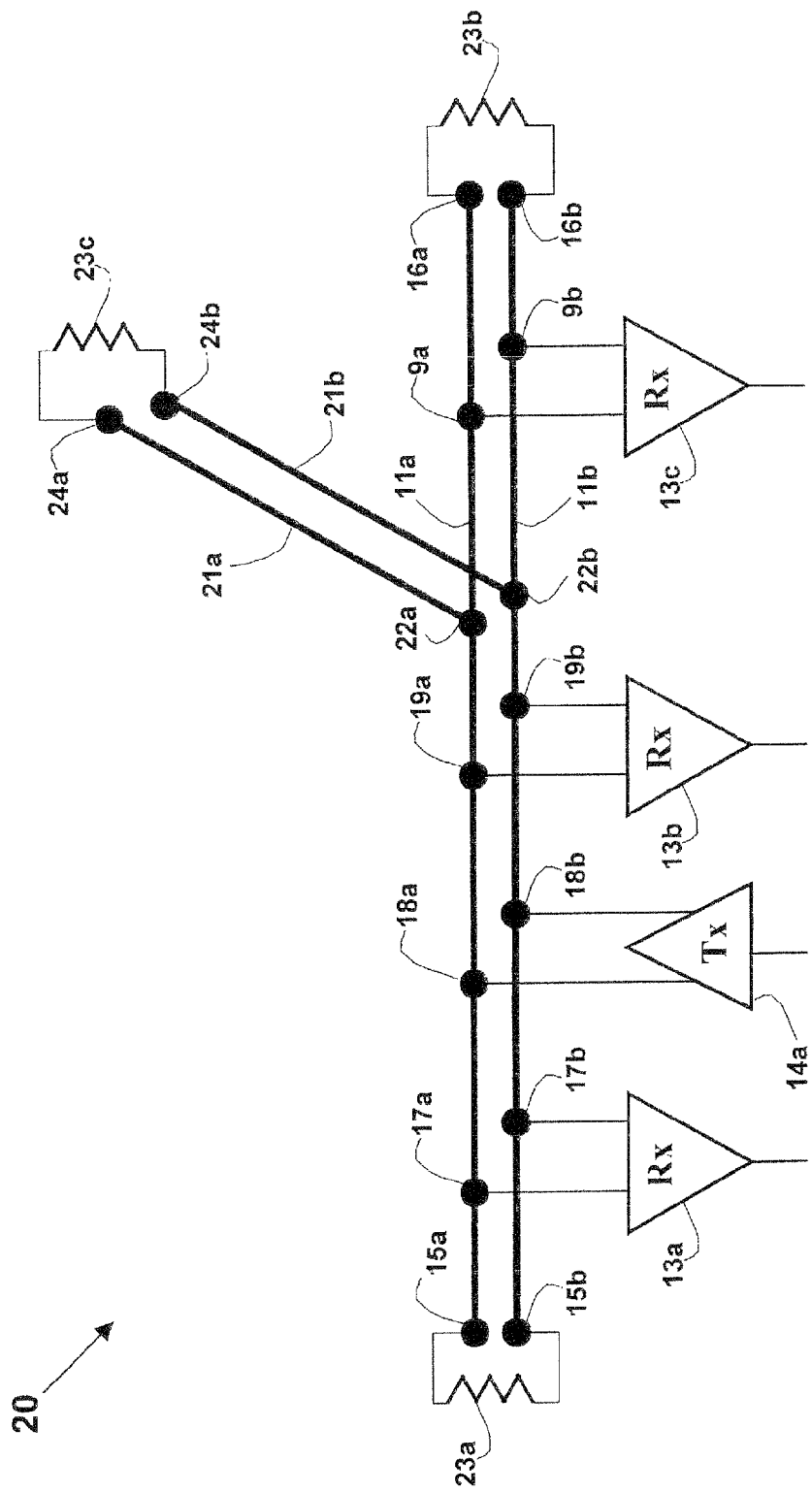
Figure 2 (Prior-Art)

US 8,391,470 B2

DEVICE, METHOD AND SYSTEM FOR ESTIMATING THE TERMINATION TO A WIRED TRANSMISSION-LINE BASED ON DETERMINATION OF CHARACTERISTIC IMPEDANCE

CROSS-REFERENCE TO RELATED APPLICATION

This is a division of pending U.S. application Ser. No. 11/091,371, filed on Mar. 29, 2005, the entire disclosure of which are incorporated herein by reference.

FIELD OF THE INVENTION

The present invention relates to the field of measuring transmission-line parameters, and specifically the characteristic impedance of a transmission line.

BACKGROUND OF THE INVENTION

Wired communication network topologies may generally be segmented into two types: Point-to-point and multi-point (also known as 'point-to-multipoint', 'bus' and 'shared medium') networks. In point-to-point topology, the network employs one or more communication links, each link is based on a cable or wires as the communication medium and connects exactly two nodes, wherein each node is connected to an end of the cable. In multipoint configuration, multiple nodes are connected in parallel to the same wired medium is various points along the cable. Non limiting examples of point-to-point based communication networks are Local Area Network (LAN) Ethernet IEEE802.3 10BaseT, 100BaseTX, EIA/TIA-422 (a.k.a. RS-422), ISDN (U-Interface), EIA/TIA-449, IEEE1284, IEEE1394 and USB, and Wide Area Networks (WAN) such as HDSL (High speed Digital Subscriber Line), ADSL (Asymmetric Digital Subscriber Line) and other xDSL technologies (e.g. SHDSL, SDSL, VDSL, IDSL). Non-limiting examples of LANs employing multi-point topology are Ethernet IEEE802.3 10Base2, 10Base5, CAN, LON, and ETA/TIA-485 (a.k.a. RS-485). Other multipoint in-home networks include telephone line based communication such as HomePNA™ (Home Phoneline Networking Alliance), described in www.homepna.org, and powerline based communication such as HomePlug™, described in www.homeplug.org.

A non-limiting example of a unidirectional point-to-point communication link is shown as network 5 in FIG. 1. The network comprises a communication link based on two conductors 11a and 11b cable. A transmitter 14a is connected to one end of the cable at points 7a and 7b. Respective points 6a and 6b at the other end of the cable are connected to a receiver 13a and termination 12a. The signal is coupled to the cable by the transmitter 14a. The signal energy is propagated over the cable and absorbed by the termination 12a, and received by the receiver 13a.

The term 'transmitter' herein includes any device which is capable of outputting energy or driving (or exciting) a signal, including an electrical signal, in a transmission-line. Such devices include line-drivers, modems and transceivers, as well as any other device having excitation capability. Such a signal may either be voltage based, current based or a combination of both. Similarly, the term 'receiver' herein includes any device which is able to receive energy/signal (or any function thereof) from a coupled transmission line and convert it to an electrical form, including line receivers, modems and transceivers. Receivers are assumed herein not to include any termination functionality (such as very high input impedance).

A transmission-line is defined as a medium used to carry a signal from a point A to a point B. The terms 'line', 'transmission line', 'cable', 'wiring', 'wire pair' as used herein should be interpreted to include any type of transmission-line, and specifically a metallic transmission line comprising two or more conductors used to carry electrical signals. Non-limiting examples are coaxial cable, PCB connections and twisted pair, the latter including both UTP (unshielded twisted-pair) and STP (shielded twisted-pair), as well as connections within Application Specific Integrated Circuits (ASICs). Characteristics of wired transmission-lines and their effect over digital data transmission are described for example in National Semiconductor Corporation Application Note 806 (April 1992) entitled: "Data Transmission Lines and their Characteristics", and in National Semiconductor Corporation Application Note 808 (March 1992) entitled: "Long Transmission Lines and Data Signal Quality". Characteristic impedance is a primary property of a metallic transmission line, and commonly relates to the instantaneous voltages and currents of waves traveling along the line.

The basic function of the termination 12a is to fully absorb the signal/energy propagating in the transmission line. Improper termination such as impedance mismatch will cause reflections (a.k.a ringing, overshoot, undershoot, distortion and resonance) back from the receiver-connected end to the transmitter-connected end. Such reflections will commonly degrade the communication characteristics of the communication link. Proper line termination becomes increasingly important as designs migrate towards higher data signal transfer rates over relatively longer lengths or transmission medium. For example, this may be applied to differential data transmission over two conductors such as twisted pair cable. In general, transmission-lines such as cables are treated as transmission-lines when the component wavelengths of the propagating signal, such as an electrical signal in a cable, is shorter than the physical length of the transmission-line. The importance of a proper line termination is discussed for example in National Semiconductor Corporation Application Note 108 (July 1986) entitled: "Transmission Line Characteristics". A proper line termination typically enables better ability to reliably recover a transmitted signal by using simpler means, as well as improving noise susceptibility.

Analysis of reflections can be found in the National Semiconductor Corporation Application Note 807, (March 1992) entitled: "Reflections: Computations and Waveforms", and the manner in which reflections impact on data transmission systems is described in the National Semiconductor Corporation Application Note 903 (August 1993) entitled: "A Comparison of Differential Termination Techniques".

Generally, in order to avoid reflection, the termination impedance should match the characteristic impedance of the transmission line in the frequency band of the discussed signal. If the cable parameters are known, and in particular its characteristic impedance (commonly designated as Z0), a good practice is to install a termination (a.k.a. terminator) 12a of the same value (Z0). In many cases, the cable parameters may be unknown. For example, the cable may exist in a wall and/or be of unknown type. Furthermore, cables may be manufactured with relatively large parameters tolerances, resulting in variations of characteristic impedance from batch to batch. Similarly, the characteristic impedance may change due to environmental conditions such as temperature, humidity and also over time. In any case wherein the cable parameters are not known, a measurement needs to be performed in order to establish the cable characteristic impedance, and accordingly terminating the line. Such measurement requires expertise, is labor extensive and time consuming.

There is thus a widely recognized need for, and it would be highly advantageous to have, a method and system for allowing easy and simple measuring of characteristic impedance, upon which a proper termination of a transmission line may be calculated, for example. Such system may be applied to transmission lines in general, and wired networks in particular, and specifically for a metallic transmission line having an unknown or changing characteristic impedance.

A multi-point based network (a.k.a. bus or multidrop network) is shown as network 10 in FIG. 1a. Two conductors 11a and 11b are used as the communication medium, wherein multiple nodes are connected thereto, each node connected at a distinct point along the line. The network is shown in a state wherein node 14a connected to the two conductors 11a and 11b of the line at respective connection points 18a and 18b is a transmitter, while all other nodes serve as receivers. Nodes 13a, 13b and 13c serve as receivers and are connected to the line at respective points (17a, 17b), (19a, 19b) and (9a, 9b) respectively. Similar to the above discussion, a termination (equal to the line characteristic impedance) is connected to each end, wherein terminations 12a and 12b are respectively connected to the transmission line ends (15a, 15b) and (16a, 16b).

Typically in wired communication, the wiring characteristic impedance is near pure resistance (non-complex impedance); hence each termination could be a simple resistor having a resistance equal to the characteristic impedance. Such resistors 23 are shown as terminations and are connected to the transmission line end points (such as 16a, 16b) of network 20 shown in FIG. 2.

While the metallic transmission line 5 shown in FIG. 1 is a non-tapped, single-path, homogenous and continuous wiring, a transmission line may sometimes involves a tap (a.k.a stub, bridge, and bridge-tap) or any other discontinuity. Such medium is shown in FIG. 2 as network 20. In addition to the two conductors 11a and 11b, the network employs an additional wiring part (a tap) comprising two conductors 21a and 21b, tapped in connection points 22a and 22b respectively. Similar to the above discussion, a termination is required in each line end, hence requiring resistor 23c connected across the tap end points 24a and 24b. Similarly, a wired network may employ multiple such taps. Hence for a line having arbitrary topology such as 'star', 'tree' or any combination thereof, the taps may be without any node connection (such as shown in network 20), or may have nodes connected thereto. In addition, nodes may be connected to one or more of the line ends, in parallel to the termination.

In a multi-point environment, while termination is essential in all wiring ends in order to reduce reflections, it is equally important not to introduce termination at all points other than the cable ends. Any impedance connected will cause a mismatch and a signal propagated will introduce reflections at that point. As such, the nodes 13a, 13b and 13c should exhibit high impedance in their connection points to the transmission line.

In many cases, nodes (in particular receivers) comprise a built-in termination/resistor. If the node is connected in one of the line ends, the termination should be connected in parallel to the node. However, in a configuration wherein the node is not located in the line ends, the termination should be disconnected or disabled, in order to avoid generation of reflections. Such distinction between the connection locations complicates the network installation. Furthermore, in some cases the wiring topology is not easily known, such as in the case of in-wall existing wiring. Identifying the topology in order to distinguish between line ends and other points may be complex, labor intensive and expensive.

There is thus a widely recognized need for, and it would be highly advantageous to have, a method and system for allowing easy and simple termination of a transmission line in general, and wired networks in particular, and specifically for a metallic transmission line having multiple connection points, unknown to be either ends or in the middle of a wiring system.

Wired Home Networking.

Most existing offices and some of the newly built buildings facilitate a data network structure based on dedicated wiring. However, implementing such a network in existing buildings typically requires installation of new wiring infrastructure. Such installation of new wiring may be impractical, expensive and problematic. As a result, many technologies (referred to as "no new wires" technologies) have been proposed in order to facilitate a LAN in a building without adding new wiring. Some of these techniques use existing utility wiring installed primarily for other purposes such as telephone, electricity, cable television (CATV), and so forth. Such an approach offers the advantage of being able to install such systems and networks without the additional and often substantial cost of installing separate wiring within the building.

The technical aspect for allowing the wiring to carry both the service (such as telephony, electricity and CATV) and the data communication signal commonly involves using FDM technique (Frequency Division Multiplexing). In such configuration, the service signal and the data communication signals are carried across the respective utility wiring each using a distinct frequency spectrum band. The concept of FDM is known in the art, and provides means of splitting the bandwidth carried by a medium such as wiring. In the case of telephone wiring carrying both telephony and data communication signals, the frequency spectrum is split into a low-frequency band capable of carrying an analog telephony signal and a high-frequency band capable of carrying data communication or other signals.

A network in a house based on using powerline-based home network is also known in the art. The medium for networking is the in-house power lines, which is used for carrying both the mains power and the data communication signals. A PLC (Power Line Carrier) modem converts a data communication signal (such as Ethernet IEEE802.3) to a signal which can be carried over the power lines, without affecting and being affected by the power signal available over those wires. A consortium named HomePlug Powerline Alliance, Inc. of San Ramon, Calif. USA is active in standardizing powerline technologies. A powerline communication system is described in U.S. Pat. No. 6,243,571 to Bullock et al., which also provides a comprehensive list of prior art publications referring to powerline technology and application. An example of such PLC modem housed as a snap-on module is HomePlug1.0 based Ethernet-to-Powerline Bridge model DHP-100 from D-Link® Systems, Inc. of Irvine, Calif., USA. Outlets with built in PLC modems for use with combined data and power using powerlines are described in U.S. Patent Application 2003/0062990 to Schaeffer et al. entitled 'Powerline bridge apparatus'. Such power outlets are available as part of PlugLAN™ by Asoka USA Corporation of San Carlos, Calif. USA.

Similarly, carrying data over existing in home CATV coaxial cabling is also known in the art, for example in U.S. Patent application 2002/0166124 to Gurantz et al. An example of home networking over CATV coaxial cables using outlets is described in U.S. Patent application 2002/0194383 to Cohen et al. Such outlets are available as part of HomeRAN™ system from TMT Ltd. of Jerusalem, Israel.

Telephony Definitions and Background

The term "telephony" herein denotes in general any kind of telephone service, including analog and digital service, such as Integrated Services Digital Network (ISDN).

Analog telephony, popularly known as "Plain Old Telephone Service" ("POTS") has been in existence for over 100 years, and is well designed and well engineered for the transmission and switching of voice signals in the 300-3400 Hz portion (or "voice band" or "telephone band") of the audio spectrum. The familiar POTS network supports real-time, low-latency, high-reliability, moderate-fidelity voice telephony, and is capable of establishing a session between two end-points, each using an analog telephone set.

The terms "telephone", "telephone set", and "telephone device" herein denote any apparatus, without limitation, which can connect to a Public Switch Telephone Network ("PSTN"), including apparatus for both analog and digital telephony, non-limiting examples of which are analog telephones, digital telephones, facsimile ("fax") machines, automatic telephone answering machines, voice (a.k.a. dial-up) modems, and data modems.

The terms "data unit", "computer" and "personal computer" ("PC") are used herein interchangeably to include workstations, Personal Digital Assistants (PDA) and other data terminal equipment (DTE) with interfaces for connection to a local area network, as well as any other functional unit of a data station that serves as a data source or a data sink (or both).

In-home telephone service usually employs two or four wires, to which telephone sets are connected via telephone outlets.

Home Networking Existing In—House Wiring.

Similarly to the powerlines and CATV cabling described above, it is often desirable to use existing telephone wiring simultaneously for both telephony and data networking. In this way, establishing a new local area network in a home or other building is simplified, because there is no need to install additional wiring. Using FDM technique to carry video over active residential telephone wiring is disclosed by U.S. Pat. No. 5,010,399 to Goodman et al. and U.S. Pat. No. 5,621,455 to Rogers et al.

Existing products for carrying data digitally over residential telephone wiring concurrently with active telephone service by using FDM commonly uses a technology known as HomePNA (Home Phoneline Networking Alliance) whose phonelines interface has been standardized as ITU-T (ITU Telecommunication Standardization Sector) recommendation G.989.1. The HomePNA technology is described in U.S. Pat. No. 6,069,899 to Foley, U.S. Pat. No. 5,896,443 to Dichter, U.S. Patent application 2002/0019966 to Yagil et al., U.S. Patent application 2003/0139151 to Lifshitz et al. and others. The available bandwidth over the wiring is split into a low-frequency band capable of carrying an analog telephony signal (POTS), and a high-frequency band is allocated for carrying data communication signals. In such FDM based configuration, telephony is not affected, while a data communication capability is provided over existing telephone wiring within a home.

Outlets

The term "outlet" herein denotes an electro-mechanical device, which facilitates easy, rapid connection and disconnection of external devices to and from wiring installed within a building. An outlet commonly has a fixed connection to the wiring, and permits the easy connection of external devices as desired, commonly by means of an integrated standard connector in a faceplate. The outlet is normally mechanically attached to, or mounted in, a wall or similar surface. Non-limiting examples of common outlets include: telephone outlets for connecting telephones and related devices; CATV outlets for connecting television sets, VCR's, and the like; outlets used as part of LAN wiring (a.k.a. structured wiring) and electrical outlets for connecting power to electrical appliances. The term "wall" herein denotes any interior or exterior surface of a building, including, but not limited to, ceilings and floors, in addition to vertical walls.

Functional Outlet Approach.

This approach involves substituting the existing service outlets with 'network' active outlets. Outlets in general (to include LAN structured wiring, electrical power outlets, telephone outlets, and cable television outlets) have evolved as passive devices being part of the wiring system house infrastructure and solely serving the purpose of providing access to the in-wall wiring. However, there is a trend towards embedding active circuitry in the outlet in order to use them as part of the home/office network, and typically to provide a standard data communication interface. In most cases, the circuits added serve the purpose of adding data interface connectivity to the outlet, added to its basic passive connectivity function.

An outlet supporting both telephony and data interfaces for use with telephone wiring is disclosed in U.S. Pat. No. 6,549,616 entitled 'Telephone outlet for implementing a local area network over telephone lines and a local area network using such outlets' to Binder. Such outlets are available as part of NetHome™ system from SercoNet Ltd. of Ra'ananna, Israel.

Another telephone outlet is described in U.S. Pat. No. 6,216,160 to Dichter, entitled 'Automatically configurable computer network'. An example of home networking over CATV coaxial cables using outlets is described in WO 02/065229 published 22 Aug., 2002 entitled: 'Cableran Networking over Coaxial Cables' to Cohen et al. Such outlets are available as part of HomeRAN™ system from TMT Ltd. of Jerusalem, Israel. Outlets for use in conjunction with wiring carrying telephony, data and entertainment signals are disclosed in U.S. Patent Application US2003/0099228 to Alcock entitled 'Local area and multimedia network using radio frequency and coaxial cable'. Outlets for use with combined data and power using powerlines are described in U.S. Patent Application US2003/0062990 to Schaeffer et al. entitled 'Powerline bridge apparatus'. Such power outlets are available as part of PlugLAN™ by Asoka USA Corporation of San Carlos, Calif. USA.

While the active outlets have been described above with regard to networks formed over wiring used for basic services (e.g. telephone, CATV and power), it will be appreciated that the invention can be equally applied to outlets used in networks using dedicated wiring. In such a case, the outlet circuitry is used to provide additional interfaces to an outlet, beyond the basic service of single data connectivity interface. For example, it may be used to provide multiple data interfaces wherein the wiring supports single such data connection. An example of such outlet is the Network Jack™ product family manufactured by 3Com™ of Santa-Clara, Calif., U.S.A. In addition, such outlets are described in U.S. Pat. No. 6,108,331 to Thompson entitled 'Single Medium Wiring Scheme for Multiple Signal Distribution in Building and Access Port Therefor' as well as U.S. Patent Application US 2003/0112965 Published Jun. 19, 2003 to McNamara et al. entitled 'Active Wall Outlet'.

While the active outlets have been described with regard to outlets and networks based on conductive media such as wires and cables, it will be appreciated that such outlets are equally applicable in the case wherein the network medium is non-conductive, such as fiber-optical cabling. Active outlets supporting data interfaces and based on fiber optic cabling are described in U.S. Patent Application US 2002/0146207 Published Oct. 10, 2002 to Chu, entitled 'Fiber Converter Faceplate Outlet', as well as in U.S. Pat. No. 6,108,331 to Thompson entitled 'Single Medium Wiring Scheme for Multiple Signal Distribution in Building and Access Port Therefor'. As such, the term 'wiring' as used in this application as well as in the appended claims should be interpreted to include networks based on non-conductive media such as fiber-optics cabling.

While the outlets described above use active circuitry for splitting the data and service signals, passive implementations are also available. An example of such a passive outlet is disclosed in WO 02/25920 to Binder entitled 'Telephone communication system and method over local area network wiring'. Such outlets are available as part of the etherSPLIT system from QLynk Communication Inc. of College Station, Tex. USA. etherSPLIT is a registered trademark of Dynamic Information Systems.

The described above outlets are complete and self-contained devices. As such, they can be easily installed in new houses instead of regular passive simple outlets. However, such solutions are not appropriate in the case of retrofitting existing wiring systems. In most cases, any such modification will require dismantling the existing outlets and installing the new ones having the improved features. Such activity is cumbersome, expensive and will often require professional skill. Furthermore, owing to safety aspects involved while handling hazardous voltages (such as in the powerlines and telephone lines), local regulations may require only certified personnel to handle the wiring, making it expensive and militating against a do-it-yourself approach.

Furthermore, as the technology and environment change in time, a need to upgrade, modify or change the outlet functionalities, features and characteristics may arise. For example, the data interface may need to be upgraded to interconnect with new standards. In another example, the circuitry may need to be upgraded to support higher bandwidth. Similarly, management and Quality of Service (QoS) functionalities may need to be either introduced or upgraded. In yet other examples, additional functionalities and interfaces may need to be added. Using complete self-contained outlets as a substitute to the existing ones also introduces the disadvantages described above.

Plug-in Device.

One approach to adding functionality to existing outlets is by using a plug-in module. Such plug-in modules are described in U.S. Patent Application US 2002/0039388 to Smart et al. entitled 'High data-rate powerline network system and method', US Patent Application US 2002/0060617 to Walbeck et al. entitled 'Modular power line network adapter' and also in U.S. Patent Application US 2003/0062990 to Schaeffer, J R et al. entitled 'Powerline bridge apparatus'. Such a module using HomePlug™ technology are available from multiple sources such as part of PlugLink™ products by Asoka USA Corporation of San Carlos, Calif., USA. HomePlug is a trademark of HomePlug Powerline Alliance, Inc. of San Ramon, Calif., USA. Various types of snap-on devices are also described in WO 04/001034.

SUMMARY OF THE INVENTION

According to one aspect of the invention, a transmission line characteristic impedance is measured by applying regular lumped impedance/resistance measuring. Any other lumped or distributed impedance/resistance measuring technique known in the art may be equally applied. In one aspect of the invention the measurement is based on transmitting, sourcing or exciting an electrical signal, either voltage or current (or both). In one aspect of the invention the measurement is based on exciting a known energy into the transmission-line, and measuring the current flow to the transmission line directly or indirectly such as using voltage divider. The measured values are used to calculate the transmission-line characteristic impedance. Measuring the characteristic impedance may be initiated periodically, upon receiving an external electrical signal (e.g. from another system), upon manually applying a signal, or upon powering up, or upon sensing any other signal excitation such as packet or session as part of a data communication session.

In order to allow proper measurement, no other signals (such as reflections or data communication signals) should exist and affect the measurement. According to one aspect of the invention, the impedance (either lumped or distributed) measuring is executed shortly after injecting the measurement signal into the transmission-line, and prior to reflections arrival from taps or non-terminated ends to the measured transmission line end. Since practically transmission-lines are not homogenous and do not have infinite length, reflections from taps, non-homogenous points or non-terminated remote ends occur and will arrive to the measured end. Thus, the measurement should be executed and completed shortly after applying the measurement signal, before the reflections arrive to this line end. In order to make any subsequent use of the measured value, the calculated characteristic impedance (or any function thereof such as the voltage/current measured) should be stored.

According to one aspect of the invention the transmission-line serves as a medium for data communication. In such configuration, a modem (being transmitter, receiver, transceiver or the like) is connected to a point along the transmission-line as well as to the transmission-line end-point relating to the impedance measurement. Characteristic impedance measurement may be used to determine whether a termination is required in a specific connection point. According to one aspect of the invention the termination value is determined according to the measured characteristic impedance. For example, the termination value can be set to be equal to the measured lumped impedance in order to minimize reflection in an end-point. In the case wherein data communication is involved over the same transmission-line, time domain multiplexing is used to allow both the modem and the measurement to share the transmission line, wherein the modem operation should be halted during the impedance measurement, in order not to interfere with the measurement and to enable proper and accurate measurement. According to one aspect of the invention, this is achieved by disconnecting the modem (to include transceiver and transmitter) from the transmission-line during the measurement phase, and re-connecting it after the measurement is completed. As such, the system may be exclusively in either a measurement state or a data communication state.

According to one aspect of the invention, a frequency division multiplexing (FDM) approach is applied in order to concurrently carry both an application signal (such as data communication signal) and an impedance measurement related signal over the transmission-line. Tn this arrangement, the measurement system uses a signal carried in one or more frequency bands distinct from the band wherein the application signal is carried. The characteristic impedance of the transmission-line in the frequency band or bands not being part of the measurement system may be approximated using known extrapolation or interpolation techniques.

According to one aspect of the invention, the measured/calculated transmission-line characteristic impedance is used for estimating the count of wire pairs connected to a single connection point, for use with one or more similar wire pairs having similar nominal characteristic impedance Z0 and all connected to the single connection point. By instantaneously measuring the connection point lumped impedance Z, the connected wire pairs count can be estimated to be Z0/Z. The estimated pairs count may be visually indicated to a user as part of a pairs count test-set.

According to one aspect of the invention, the pair count is used to identify the end point of an unknown wiring structure. In the case wherein Z=Z0, a single wire pair connection-point is detected, thus requiring a termination to be connected to this point in order to minimize reflections from this wire-pair end-point.

According to one aspect of the invention in-wall hidden wire-pairs are measured. Such wire pairs may comprise telephone, AC power or CATV wiring infrastructure, as well as any other wiring. The wire pair may be carrying service signals (such as telephone, AC power or CATV signals), and may be accessed via outlets (such as telephone, AC power or CATV outlets). In the case wherein outlets are used to connect to the wiring, the impedance measuring or the termination setting or both circuits may be integrated (in part or in frill) into the outlet.

According to one aspect of the invention for use with a transmission-line carrying a signal and having a nominal characteristic impedance and terminated with a impedance-controlled termination, the proper termination value (having the same value as the nominal characteristic impedance) is matched to the transmission-line by using a closed control loop, wherein the power dissipated by the impedance-controlled termination (connected to the transmission-line) is measured and used for changing the impedance-controlled termination value to obtain a maximum power dissipation. The power dissipation by the termination can be measured directly by sensing the voltage across or the current flowing through the termination. Alternatively, the dissipated power is indirectly measured by measuring a physical phenomena affected by the dissipated power (e.g. heat).

The measuring system (in whole or in part) may be enclosed as a stand-alone unit, housed/integrated as part of a modem, or housed in integrated form as part of a service outlet or as a snap-on module. Similarly, the termination setting system (in whole or in part) may be stand-alone, or housed/integrated as part of a modem, or housed in integrated form as part of a service outlet, or as a snap-on module The above summary is not an exhaustive list of all aspects of the present invention. Indeed, the inventor contemplates that his invention includes all systems and methods that can be practiced from all suitable combinations of the various aspects summarized above, as well as those disclosed in the detailed description below and particularly pointed out in the claims filed with the application. Such combinations have particular advantages not specifically recited in the above summary.

It is understood that other embodiments of the present invention will become readily apparent to those skilled in the art from the following detailed description, wherein are shown and described only embodiments of the invention by way of illustration. As will be realized, the invention is capable of other and different embodiments and its several details are capable of modification in various other respects, all without departing from the scope of the present invention as defined by the claims. Accordingly, the drawings and detailed description are to be regarded as illustrative in nature and not as restrictive.

BRIEF DESCRIPTION OF THE DRAWINGS

The invention is herein described, by way of non-limiting example only, with reference to the accompanying drawings, wherein like designations denote like elements.

FIG. 1 illustrates schematically a point-to-point network.

FIG. 1a illustrates schematically a multi-point network.

FIG. 2 illustrates schematically a multi-point network with a tap.

DESCRIPTION OF EXEMPLARY EMBODIMENTS

Figure 3:
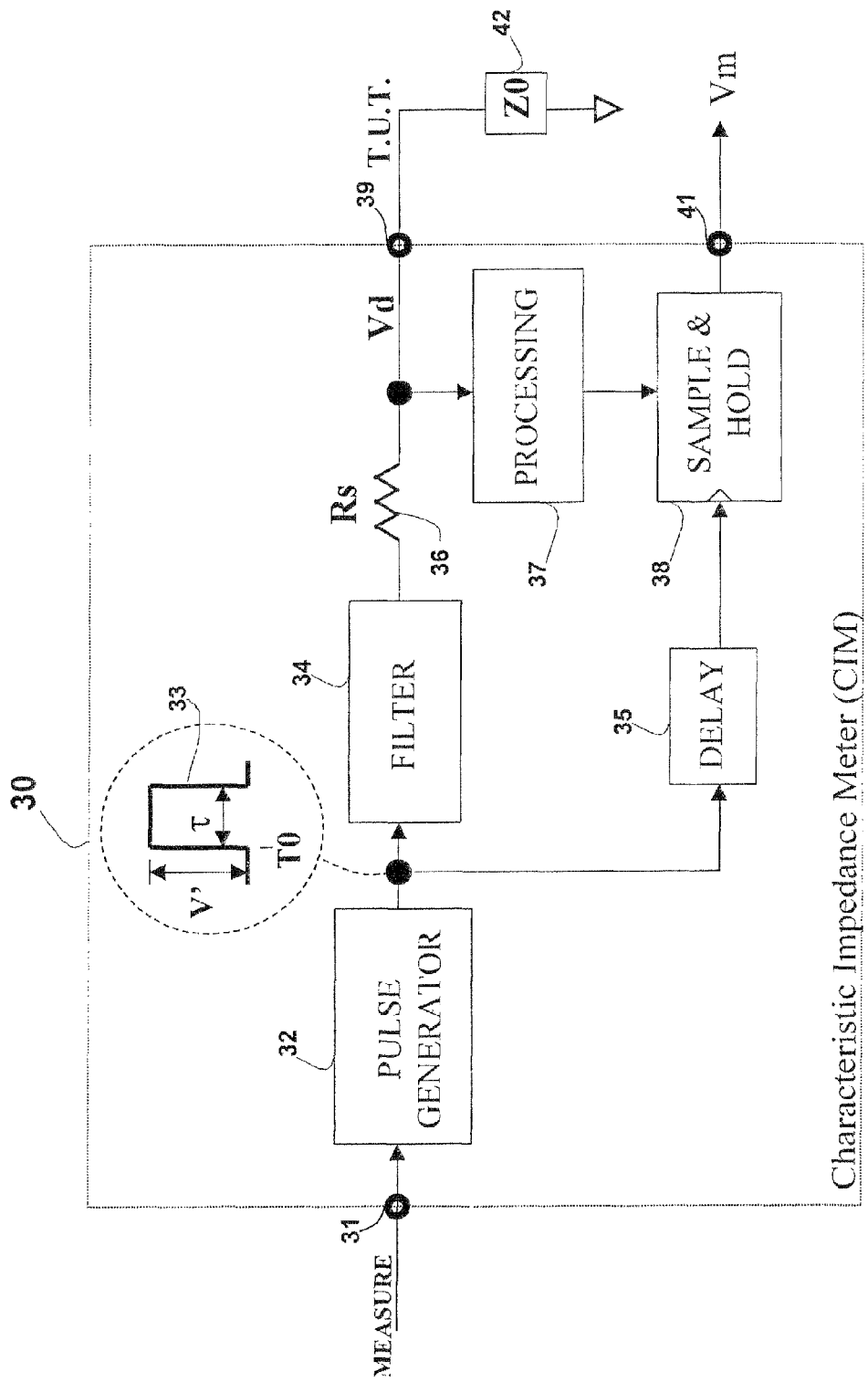
FIG. 3 illustrates schematically a general functional block diagram of an exemplary Characteristic Impedance Meter (CIM) according to the invention.

The principles and operation of a network according to the present invention may be understood with reference to the drawings and the accompanying description wherein similar components appearing in different figures are denoted by identical reference numerals. The drawings and descriptions are conceptual only. In actual practice, a single component can implement one or more functions; alternatively, each function can be implemented by a plurality of components and circuits. In the drawings and descriptions, identical reference numerals indicate those components that are common to different embodiments or configurations.

A part of one embodiment according to the present invention is shown as Characteristic Impedance Meter (CIM) 30 in FIG. 3. The CIM measures the characteristic impedance of a transmission line by applying a signal to the line, and directly measuring the input impedance into the transmission line by means of voltage division shortly afterwards. The CIM 30 measures the characteristic impedance of the Transmission line Under Test (T.U.T or TUT) 42 connected via port 39, and having an unknown characteristic impedance Z0. The measurement sequence starts upon sensing a MEASURE signal in port 31, signaling the CIM to start the measurement process. The MEASURE signal at port 31 is fed to pulse generator 32, which outputs a pulse shown as square wave pulse signal 33. The pulse signal waveform 33 starts at time T0, is $\tau$ seconds long and has an amplitude of V' volts. In the case wherein the characteristic impedance is required to be measured in a specific and/or limited frequency band, the pulse signal is then fed to a band-pass filter 34 limiting the signal energy to the required band. If the signal is generated having the frequency spectrum required, and/or if no frequency band limitations exists, such a filter 34 may be omitted. After being filtered by the filter 34, the pulse is connected to the TUT 42 via the series resistor Rs 36 connected to the port 39. The processing unit 37 is considered to have very high input impedance, hence does not interfere with the signal. The voltage at port 39 (and at the input to the processing unit 37) is as such a voltage formed by dividing V' between the resistor Rs and Z0 (pure resistive characteristic impedance is assumed). As such, the divided voltage Vd at port 39 is: Vd=V'*Z0/(Rs+Z0), assuming no attenuation by the filter 34. In the case of amplitude attenuation by the filter 34, the voltage V' reflects the amplitude at the filter 34 output. Since V' and Rs are known, the voltage Vd at port 39 is a direct function of the value of the characteristic impedance Z0. In order to allow for accurate measurement, the value of resistor Rs should be as close as possible, or at least of the same order of magnitude, as the measured impedance Z0. The voltage Vd is fed to the processing unit 37, which provides a signal output which is a function of the voltage at port 39. For example, the processing unit 37 may provide a voltage proportional to the Vd above. In another example, the processing unit 37 calculates Z0 by the equation Z0=Rs*Vd/(V'−Vd), and provides a signal (e.g. voltage) proportional to the Z0 calculated. Other transfer functions may also be considered. If processing is not required, processing unit 37 may be omitted. Assuming a practical and finite length TUT, the pulse signal starts to propagate along the transmission line, and assuming taps, non-terminated ends or any other non-continuities, a reflection signal will appear at port 39, causing the measured Vd to be inaccurate and not to reflect the actual voltage division discussed. As such, an accurate value of Vd exists at port 39 only for a short period after the pulse signal start (T0). Hence, there is a need to latch and store the value at this instant.

The pulse signal 33 is also provided to a delay unit 35. After a predetermined delay period (after T0), a signal is output to the trigger input of a sample and hold unit 38, which latches and holds the signal output from processing unit 37 as signal Vm at port 41. Hence, signal Vm (e.g. voltage) represents a function of the TUT characteristic impedance Z0. The delay value should not be too short, in order to allow an accurate and fully stabilized value. On the other hand, the delay value should not be too long in order to obviate the effect of reflections. The value of r should be small enough in order not to occupy the transmission line for long and to minimize the period required for the measurement. Similarly, the value of $\tau$ should be long enough to allow accurate and stabilize measurement. In a system that has been built and tested, a pulse of $\tau$=15 nanoseconds enabled accurate reflection-free measurement of any twisted-pair cable longer than 70 centimeters.

Hence, a known while after a MEASURE signal is sensed in port 31, the CIM will output in port 41 a signal which represents the value of the characteristic impedance Z0 of the TUT 42 connected in port 39.

Figure 4:
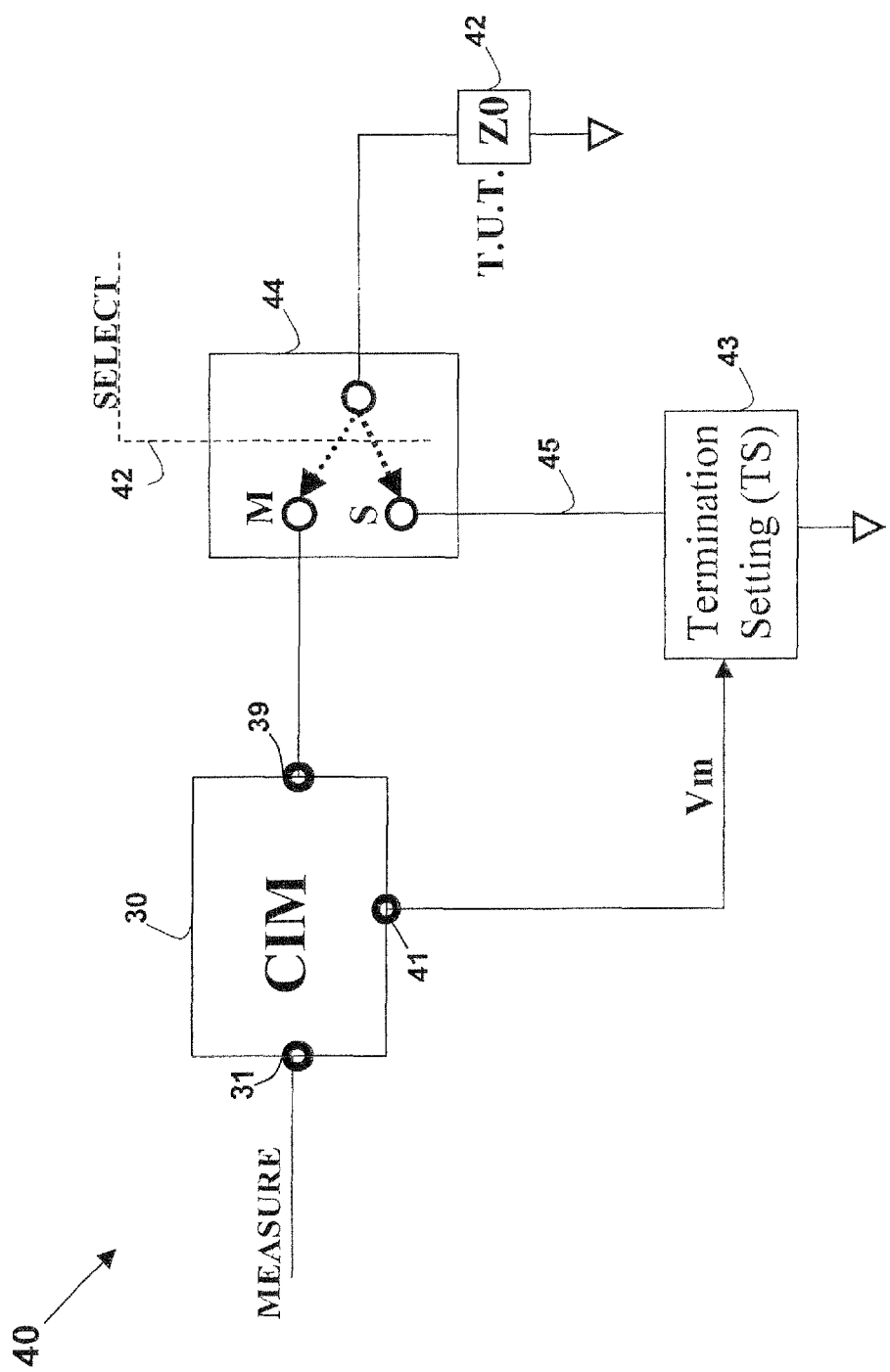
FIG. 4 illustrates schematically a general functional block diagram of an exemplary termination system according to the invention.

The CIM 30 above is operative to measure the characteristic impedance of the TUT 42. After such measurement is performed, adequate termination should be provided based on the measured value. A system 40 providing both measurement and setting of the required termination value is shown in FIG. 4. The TUT 42 shown in the figure is connected via a switch 44, having two distinct states, designated as M (Measurement) and S (Setting), the states being selected by a control signal line SELECT 49. In measurement (M) state, the TUT 42 is connected to the CIM 30 port 39, as described in FIG. 3 above. In such a state, upon application of a MEASURE signal to port 31 of the CIM 30, the CIM 30 will perform the measurement function, resulting in a continuous Vm signal representing the measured characteristic impedance Z0 value. The Vm signal at port 41 of the CIM 30 drives the Termination Setting (TS) unit 43. The TS 43 functions to exhibit the required termination value. Typically, an impedance value equal to the measured characteristic impedance Z0 will be used for termination, in order to minimize mismatch and reflections. At the end of the measurement period, line SELECT control 49 of switch 44 shifts to S (Setting) mode. The TUT 42 is thus disconnected from the CIM 30 and connects to the TS via line 45, resulting in a correct termination value at the end of the TUT 42, whereby the TUT is operative to be used as a communication medium terminated by unit 43.

As described above, the characteristic impedance is measured using lumped impedance measuring technique, thus treating the transmission-line as lumped entity rather than a distributed one. Such approach is valid under one or more of the following assumptions:

a. No energy (other than the signal used for impedance measuring) is being transmitted over the transmission line and received by the measuring device during the measurement cycle. As such, the measurement is solely based on the energy transmitted to the transmission-line by the measuring device, having a known value. Other energy received may impact on the accuracy of the impedance measurement.

b. Infinite length transmission line. In a very long and homogenous transmission line (e.g. having no taps/bridges and no impedance changes along the line) no reflections are generated, thus no signal interferes with the impedance measurement.

c. The measurement is executed before reflections are received in the connected end. In this scenario, it is assumed that at least a short length of the transmission line at the end used for the measurement is homogenous (e.g. no taps or impedance change), hence causing no reflections. The time interval until any reflections or any other interfering signals reach the end used for measurement is used for completing the impedance measurement, thus gaining accurate no-reflection affected measuring cycle. For example, assuming the nearest interfering point (e.g. line end point or tap) is at a point having a distance X from the measuring end, and assuming the signal propagation speed over the transmission line is V (usually close to the speed of light), this point will generate a reflection signal (as a result of the transmitted measurement signal) that will reach the transmission line end after a time delay of 2*X/V. During this time, an accurate interference-free measurement may be executed.

Figure 5:
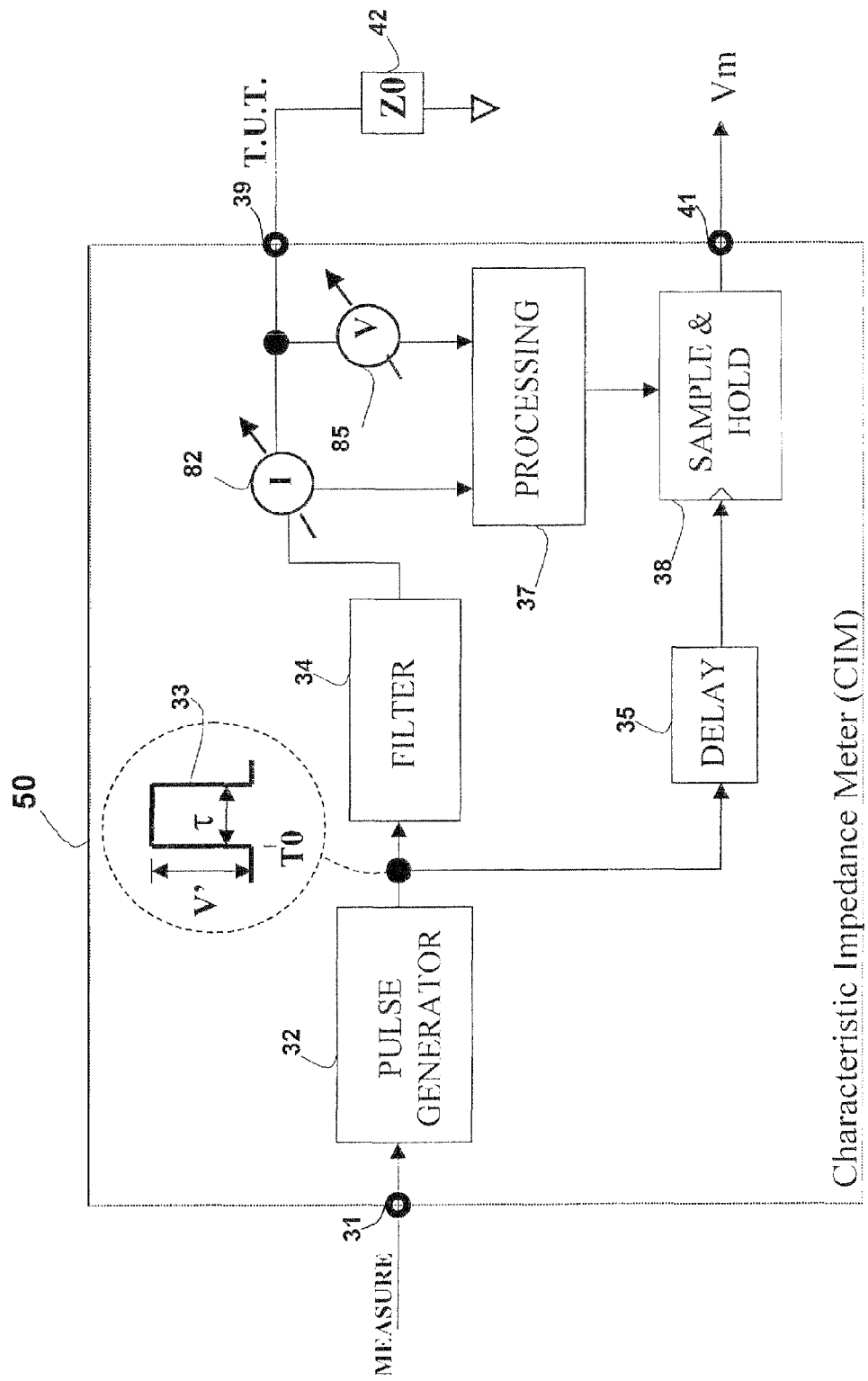
FIG. 5 illustrates schematically a general functional block diagram of an exemplary Characteristic Impedance Meter (CIM) according to the invention.

Under the above conditions a lumped impedance measurement will provide the transmission-line characteristic impedance. Any lumped impedance or resistance measurement mechanism may be used. In most cases, Ohm's law is used as the basis of such measurement. One example is shown in the CIM 30, wherein voltage excitation is applied to the TUT, and the current flowing is measured by the voltage created over a voltage divider resistor network. However, any other lumped impedance or resistance measurement mechanism may be equally used. Such an example is CIM 50 illustrated in FIG. 5. CIM 50 is based on CIM 30 structure, however the characteristic impedance lump measurement is based on directly measuring the current I flowing through the TUT 42 by an ammeter (a.k.a. ampèremeter) 82 and the voltage V across the TUT by a voltmeter 85. The processing unit 37 calculates the characteristic impedance by using Ohm's law R=V/I. In both cases of CIM 30 and CIM 50, either current or voltage excitation may be used, as well as a combination of both current and voltage excitation.

While the invention has been demonstrated with a few Ohm's law impedance/resistance measurement examples, it will be appreciated that the invention can equally be applied to any other impedance or resistance lumped measurement. Furthermore, any non-lumped measurement based on lumped or non-lumped transmission-line electrical parameters may equally be used. Furthermore, the impedance may be measured based on any transmission-line physical parameters other than electrical parameters.

In one embodiment according to the present invention the Termination Setting (TS) 43 is based on a Voltage Controlled Resistor (VCR). An implementation of such VCR is known in the art, and a non-limiting example will be based on Xicor X9015 Single Digitally Controlled Potentiometer (XDCP™), available from Intersil Corporations of Milpitas, Calif. U.S.A.

Figure 6:
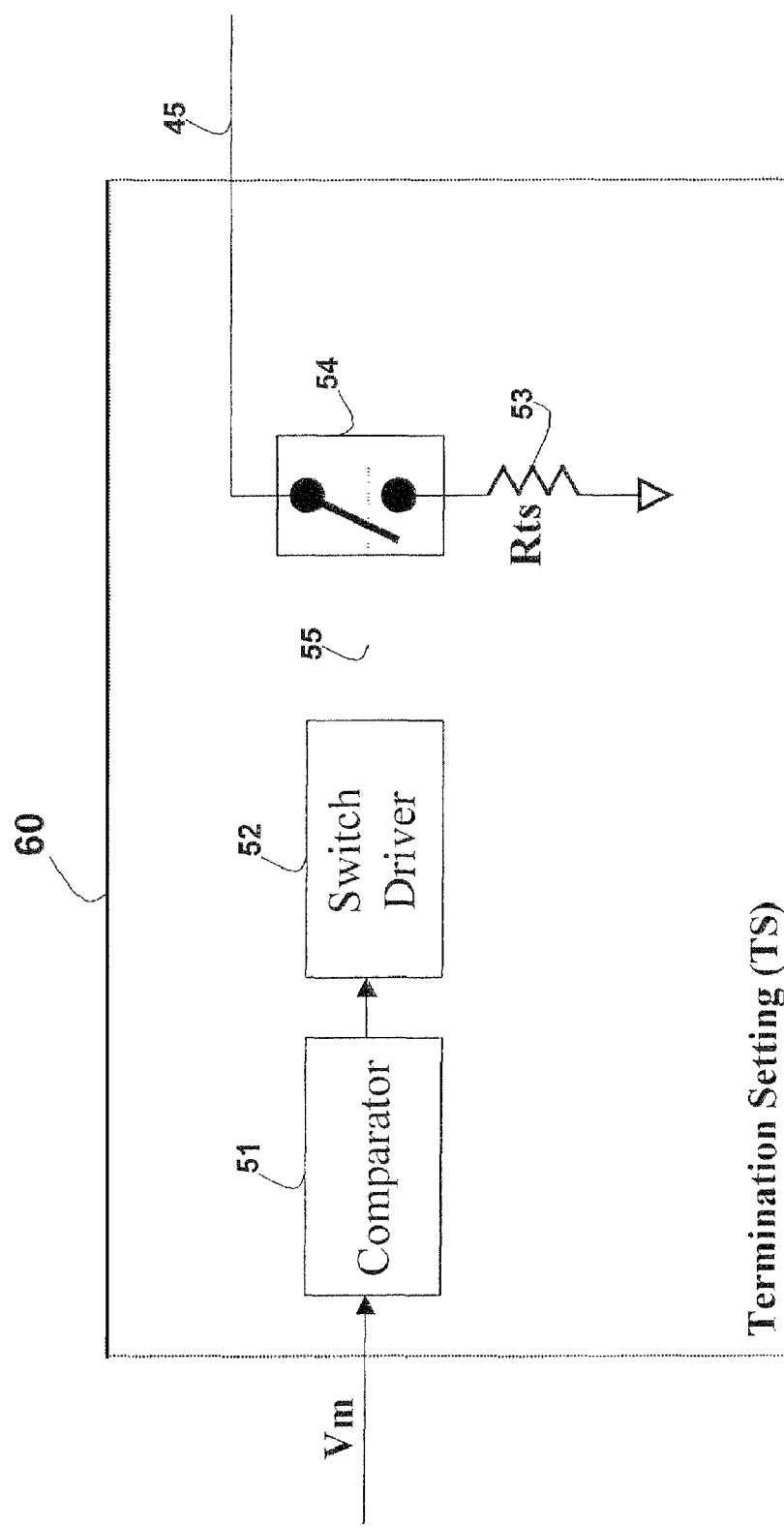
FIG. 6 illustrates schematically a general functional block diagram of an exemplary Voltage controlled Resistor (VCR).

The Termination Setting (TS) described above has a continuous setting range for the termination value. Similarly, the TS may be operative to select from a fixed set of predetermined values. Such a Termination Setting (TS) 60 is shown in FIG. 6, having two discrete values, infinity and Rts. A comparator 51 compares the incoming voltage Vm to a predetermined value. In the case wherein the Vm is above the set threshold, a signal is sent to the Switch Driver 52, which in turn operates, via a control line 55, a switch 54, which in turn connects the resistor Rts 53 to the TUT via port 45. In the case wherein the value of Vm does not cross the threshold, the switch 54 remains in the open state, resulting in a non-connected termination to the line 45, effectively an infinite resistance value. Similarly, multiple non-infinite values can be switched in as a function of the Vm input value. Switch 54 may be implemented by relay contacts, wherein line 55 is the coil operating signal or may be implemented using solid state circuitry as known in the art.

TS 60 may be used in order to decide whether a termination should be inserted or not. In the case of wiring having multiple connection points and unknown topology, there is a need to identify the wiring ends in order to connect a termination thereto, and to identify points that are not ends (referred to as non end connection points) and must be left open. An example may be the wiring 11 of system 20, having end points 15, 16 and 24, as well as non end connection points 17, 18, 19 and 9 (it is assumed that terminations 23*a*, 23*b* and 23*c* are not connected). Applying CIM 30 at an end point (such as 15, 16 and 24) will result in a Vm value representing the wiring 11 characteristic impedance value. Similarly, applying the CIM 30 to a non end connection point, will result in a Vm value of half of the characteristic impedance value, since each wiring segment connected represents its own characteristic impedance value, thus resulting in two identical values connected in parallel. In the case of a tap, such as connection point 22 in wiring 11 in system 20, wherein three branches are effectively connected, the equivalent value measured by the CIM 30 will be a third of the characteristic impedance. Since only the end-points are to be equipped with a termination, a TS 60 with a comparator 51 having a threshold equal, for example, to 0.75 of the nominal characteristic value may be used. End-points will be identified as above the threshold level, and hence will result in connection of the characteristic impedance resistor Rts 53, while non end-point connections will be automatically left open.

Process Flow.

Figure 7:
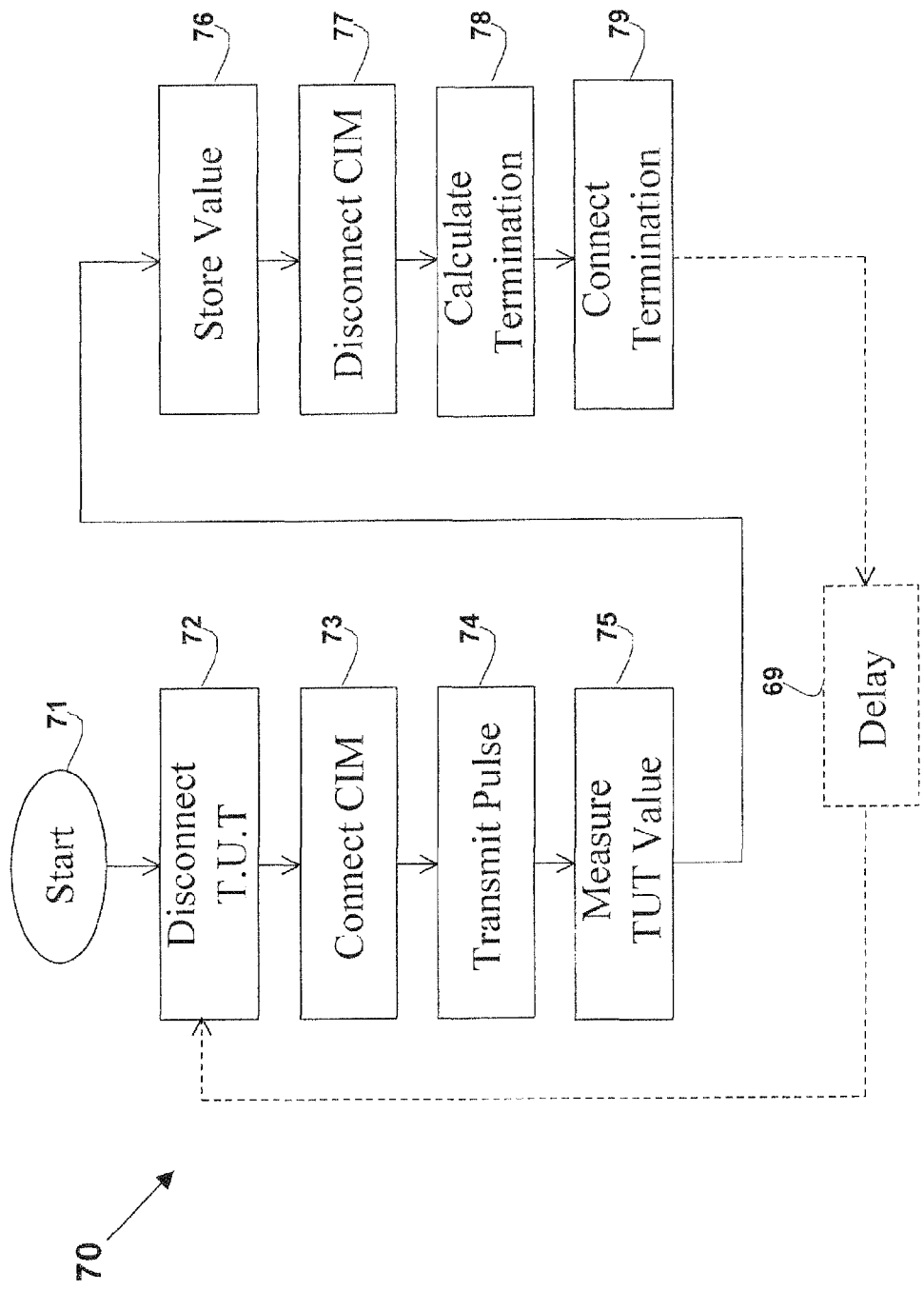
FIG. 7 illustrates schematically a general functional flow chart of an exemplary operation according to the invention.

The operations of the process involving automatic termination system are shown as flow chart 70 in FIG. 7. Starting from the Start operation 71, the TUT is disconnected in operation 72 from the modem, for example, and connects in operation 73 to a CIM. The CIM transmits energy for a short while into the TUT (in operation 74), and measures a voltage (or any other parameter) based on the TUT characteristic impedance (operation 75). The value measured which represents the TUT characteristic value is stored in operation 76. After the measuring is completed, the TUT is disconnected from the CIM (operation 77) and reconnected to a normal state of communication operation. Based on the measured value in operation 75, the required termination value (e.g. resistor value equal to the characteristic impedance) is calculated (operation 78) and connected to the TUT. In the example of system 40 above, operations 77, 78 and 79 can be carried out with the aid of TS 43 and switch 44.

While the above process may be employed only once in the system lifetime, such as only as part of the initial installation, in some embodiments the process may be repeated more than once. For example, the process may be repeated every time the system is being powered or periodically. In the latter cases, the process will be re-initiated after a delay, as described as operation 69.

As shown in the chart 70, the system may be in one of two states. The first state is the measuring state, comprising operations 72 to 78, during which the TUT parameters are measured, and the regular operation state (comprising operation 79) in which the proper termination is connected and the system operates as a wired communication system. During the regular operation state, the system uses a termination based on the measurement result of the measuring state. As such, a value representing the characteristic termination (or any function thereof) must be calculated and stored in the measuring state, to be used in the regular operation state. Such storing may use mechanical storage (such as a multi-state mechanical switch), analog value storing (such as 'sample and hold' circuitry) or digital memory.

Reflections Computations.

Figure 8A:
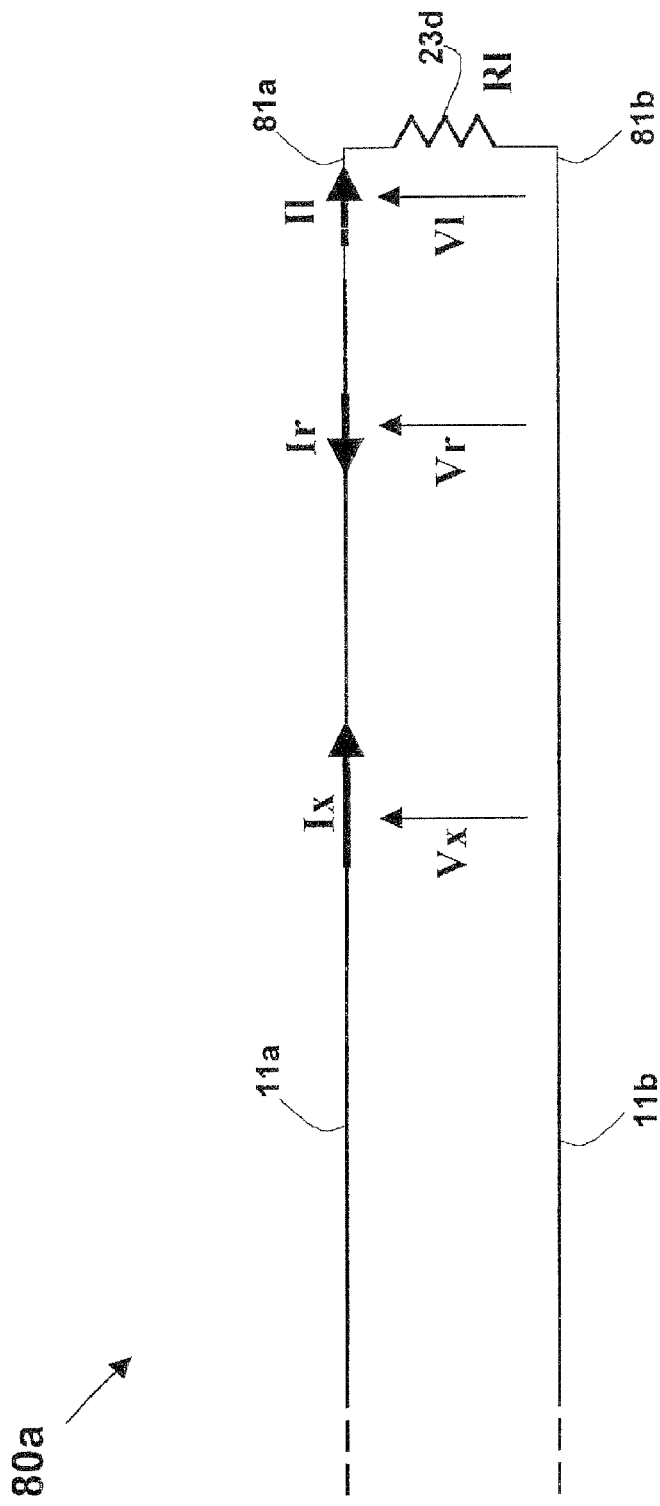
FIG. 8a illustrates schematically a general termination system.

Computations of the voltage and current involving the boundary conditions of a transmission line are known in the art, as exampled and detailed in National Semiconductors Application Note 807 (AN-807) dated March 1992. Calculations will be presented based on assuming a two conductor transmission line consisting of conductors 11*a* and 11*b*, having R0, a pure resistive characteristic impedance, and terminated at one end (points 81*a*, 81*b*) by a termination resistor 23*d* having resistance R1, as shown in system 80*a* shown in FIG. 8*a*. A signal having a voltage value of Vx and current value of Ix is propagated in the transmission line (from 'left' to 'right'). By definition, the equation $Vx=R0*Ix$ applies, and the energy propagated is equal to $Px=Ix*VX=VX^2/R0$, and for simplicity's sake, no energy loss in the transmission line is assumed. Part of the propagated energy is absorbed in the termination resistor 23d, resulting in a voltage level of V1 and current of I1, related by $V1=I1*R1$. In the case of matched termination (R1=R0), all the propagating energy will be absorbed by the termination resistor 23d, and no reflections will be generated. In the case wherein there is no matching termination, a reflection signal having a voltage of Vr and current value of Ir will be propagated from the end point (from 'right' to 'left'), wherein $Vr=Ir*R0$ applies. Applying Kirchhoff's law to the end point (81a, 81b), the current equation is I1=Ix−Ir and the voltage equation is V1=Vx+Vr. Similarly, applying the principle of energy conservation, Px=P1+Pr.

Figure 12:
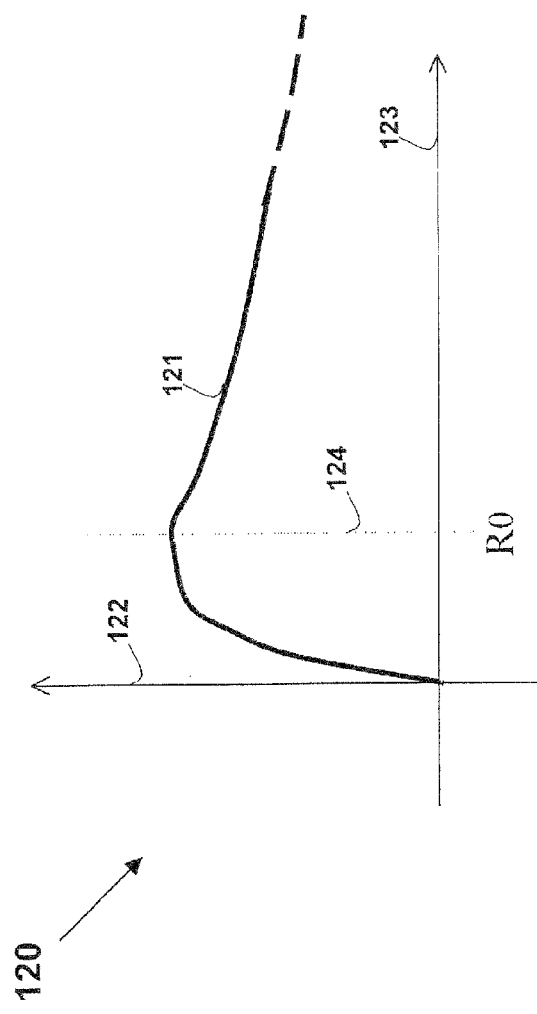
FIG. 12 illustrates schematically a graph of a dissipated power versus a termination resistance.

Manipulating the above equations results in that $P1=4*R1*Vx^2/[R0+R1)^2]$. This function is shown schematically as graph 120 in FIG. 12, wherein the X-axis 123 represents the R1 value and the Y-axis 122 represents the resulting P1. The curve 121 represents the above value of P1 as a function of the parameter R1. Further calculations show that this P1 function has a single maximum at R1=R0, shown as line 124 in graph 120, wherein the transmission line is fully matched, and the whole Px energy is absorbed in the termination (P1=Px), and no reflections are generated (Pr=0).

The above calculations suggest that tuning the termination value R1 to obtain the maximum energy dissipation over this terminating resistor, will effectively result in a well-matched termination. One option is to manually tune the termination resistance value (while energy is carried in the transmission line) while measuring the energy absorbed therein, and fixing the steady-state value to the value resulting in the maximum energy.

Figure 8B:
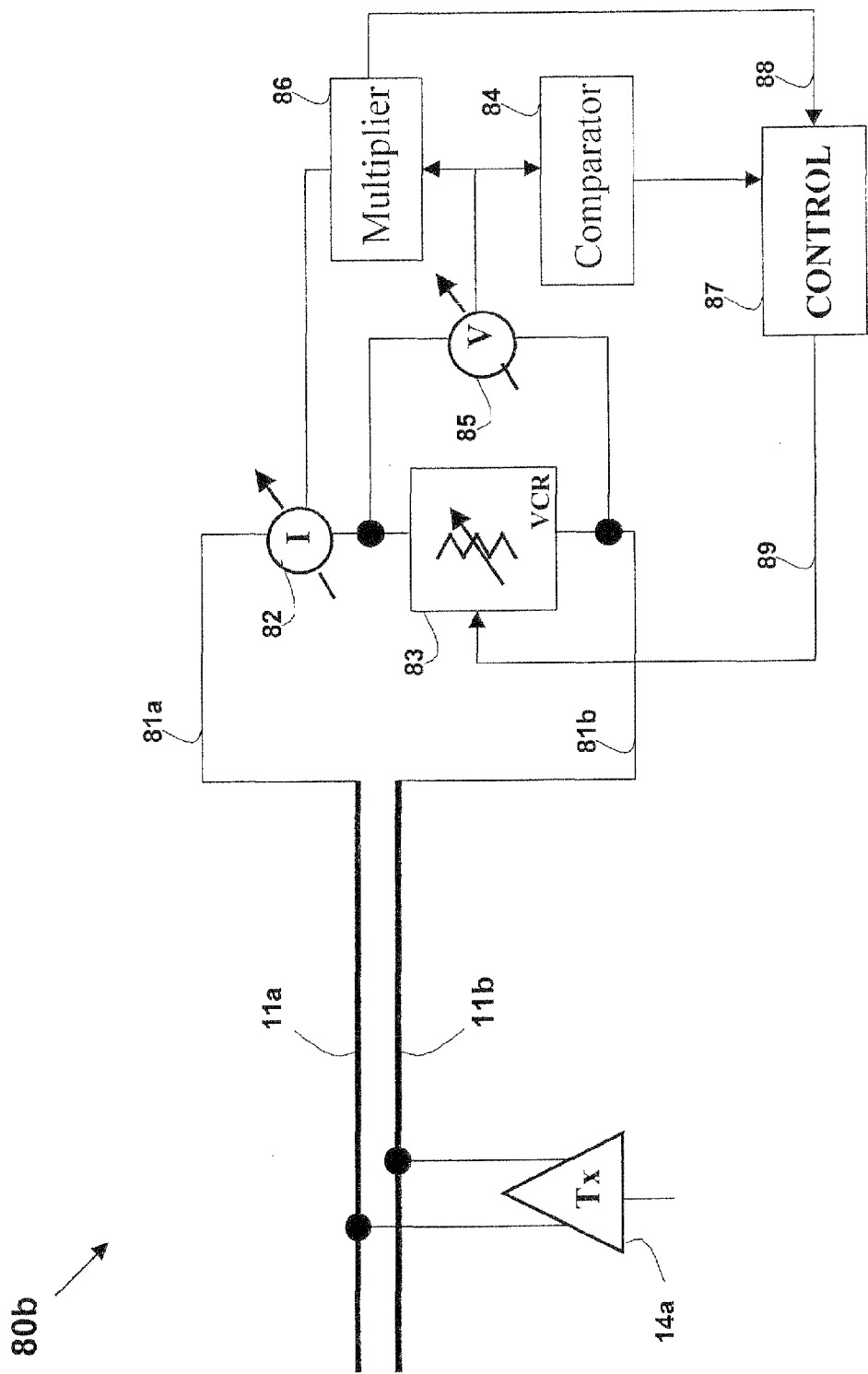
FIG. 8b illustrates schematically a general functional block diagram of an exemplary termination system according to the invention.

Alternatively, the termination value may be automatically tuned to match the characteristic impedance by maximizing the power absorption in the termination. Such a system 80b is illustrated in FIG. 8b. A tunable termination 83, such as a VCR (Voltage Controlled Resistor) is connected to the end points 81a, 81b of a line (11a, 11b), being energized by a driver 14a. The current flowing through the termination 83 is measured by a current-meter (ammeter) 82, while the voltage across the termination 83 terminals is measured by a voltage-meter (voltmeter) 85. The metered current and voltage values are multiplied in the multiplier 86, resulting in a signal which represent the power dissipating in the termination 83 (P=I*R). Similarly, only the current may be measured, and the power calculated by $P=I^2*R$, or alternatively only the voltage may be measured, using the equation $P=V^2/R$ to obtain the power. In yet another embodiment, the power is measured not directly by measuring voltage or current, bur rather by the effective power dissipated. For example, assuming that the power is converted into heat, temperature may be measured as an indication of the dissipated power.

The power representing signal is fed from multiplier 86 via line 88 to a control unit 87, which in turn controls the termination 83 resistance value via line 89. The control unit 87 is operative to effect a closed loop to set the resistance value of the VC 83 to obtain the maximum power indication on line 88.

One advantage of system 80b is that no dedicated power signal is required to be transmitted into the transmission line as part of the measurement process, but the system rather uses existing energy in the transmission line (for example, as part of normal operation). However, in many cases, proper operation of the system 80b requires a minimum received energy in the termination 83. In one embodiment, a comparator 84 senses the voltage level (as an indicator of the received power level), and allows the operation of the connected control unit 87 only upon sensing a signal level above a predefined level, ensuring proper loop operation.

Similar to the above discussion, the control loop in system 80b may be operated once (e.g. as part of the initial installation, upon manual intervention or as part of any power-on process), periodically or continuously.

System 80b has been so far described with regard to matching a proper termination value to the end point of a transmission line. In the case wherein the system in connected to a non end point, such as connection points 9, 17 and 18 in system 20 in FIG. 2, part of the 'hitting' energy Px continues to propagate along the transmission line. Applying similar computations as above results in such a case in an absorbed energy of $P1=2.25*R1*Vx^2/[R0+R1/2)^2]$. Further calculations show that this P1 function has a single maximum at R1=2*R0. Similarly, N connected lines will result in maximum absorbed energy when R1=N*R0. Hence, such mechanism may be used for pairs counting or as an end-point detector as explained below. Since for best operation of a communication system no termination should be applied to non end-points, any measured value indicating a tap rather than an end-point (e.g. maximum effected when R1 is more than 1.5*R0) should result in disconnection of the termination used for the measurement purposes.

Pairs Counting.

Figure 9:
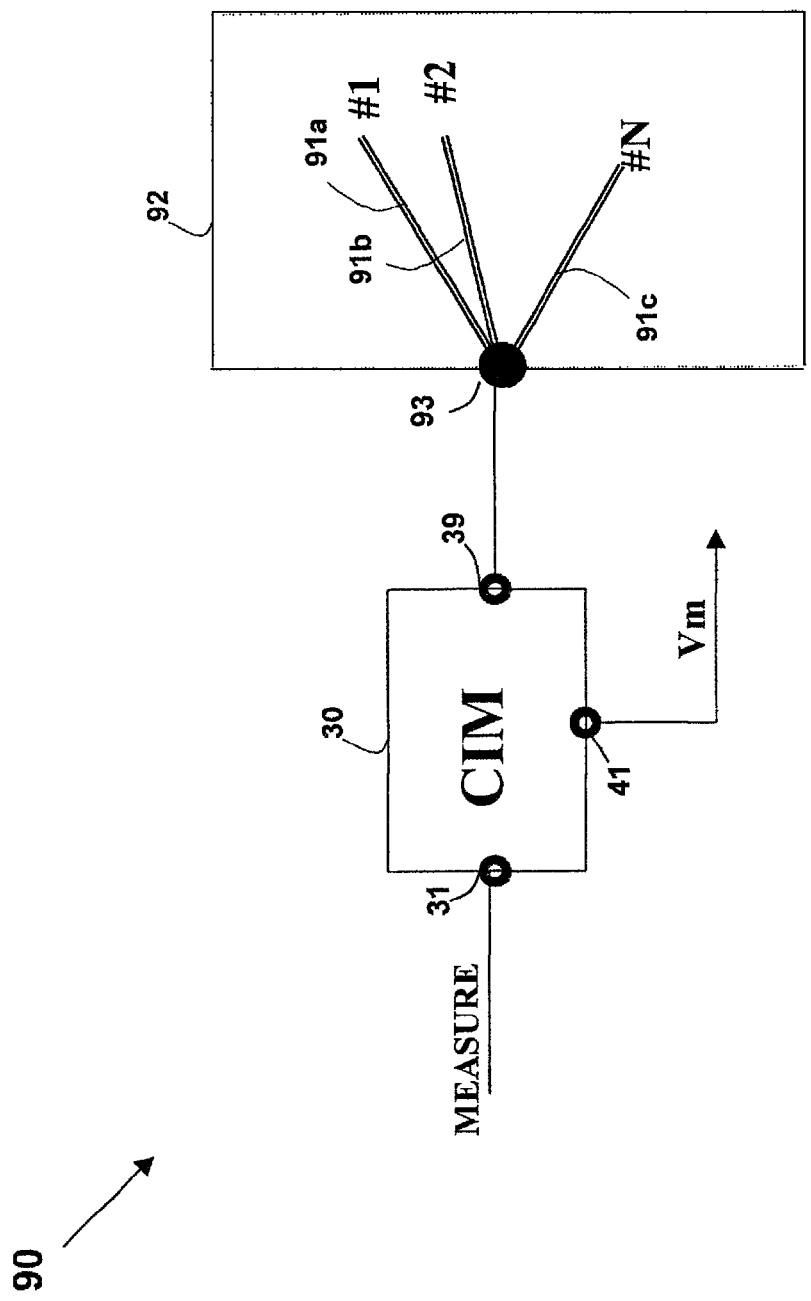
FIG. 9 illustrates schematically a general functional block diagram of an exemplary pairs counting system according to the invention.

The characteristic impedance measuring may be used as an indicator for identifying a topology of hidden wiring. Such application is shown as system 90 in FIG. 9. A wiring system 92 comprises unknown N-counted distinct pairs designated 91a, 91b up to 91c, each assumed to have the same characteristic impedance value Rt, and all being connected to a common connection point 93. A CIM 30 is connected to the connection point 93, similar to TUT connection. Since the characteristic impedances of all wirings 91 are connected in parallel, the equivalent impedance measured in point 93 is equal to Rt/N. Hence, by measuring the characteristic impedance value (represented by voltage Vm), the pair count may be inferred. For example, in the case of five equal cables each having a characteristic impedance of 100 ohms, the equivalent value measured by the CIM 30 will be 100/5=20 ohms. Such mechanism may also be applied in order to identify end-points in the case of hidden wiring topology, since such points reflect the full characteristic value Rt.

Frequency Division Multiplexing (FDM).

Figure 10:
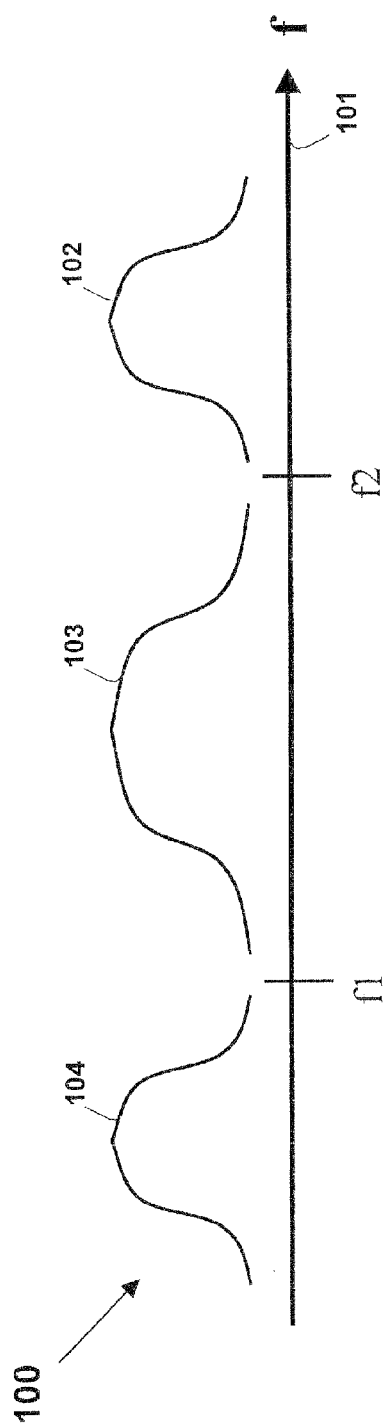
FIG. 10 illustrates schematically a frequency bands allocation scheme according to the invention.

System 40 described above is based on transmitting a signal into the transmission line over the same frequency spectrum used for the communication operation. As such, measures need to be taken in order to avoid collisions with the communication signal. Such measures may be complicated and also limits either the availability to operate the measurement system or the communication network over the transmission line. In one or more embodiments, a frequency division/domain multiplexing (FDM) mechanism is employed, wherein the communication signal is carried over a frequency band distinct from that used by the termination measurement system. An example of a frequency spectrum allocation 100 is shown in FIG. 10, illustrated along frequency axis 101. The communication system may use the frequency band 103 allocated between frequencies f1 and f2. The frequency allocation for the automatic termination system uses the band 102 above frequency f2.

Figure 11:
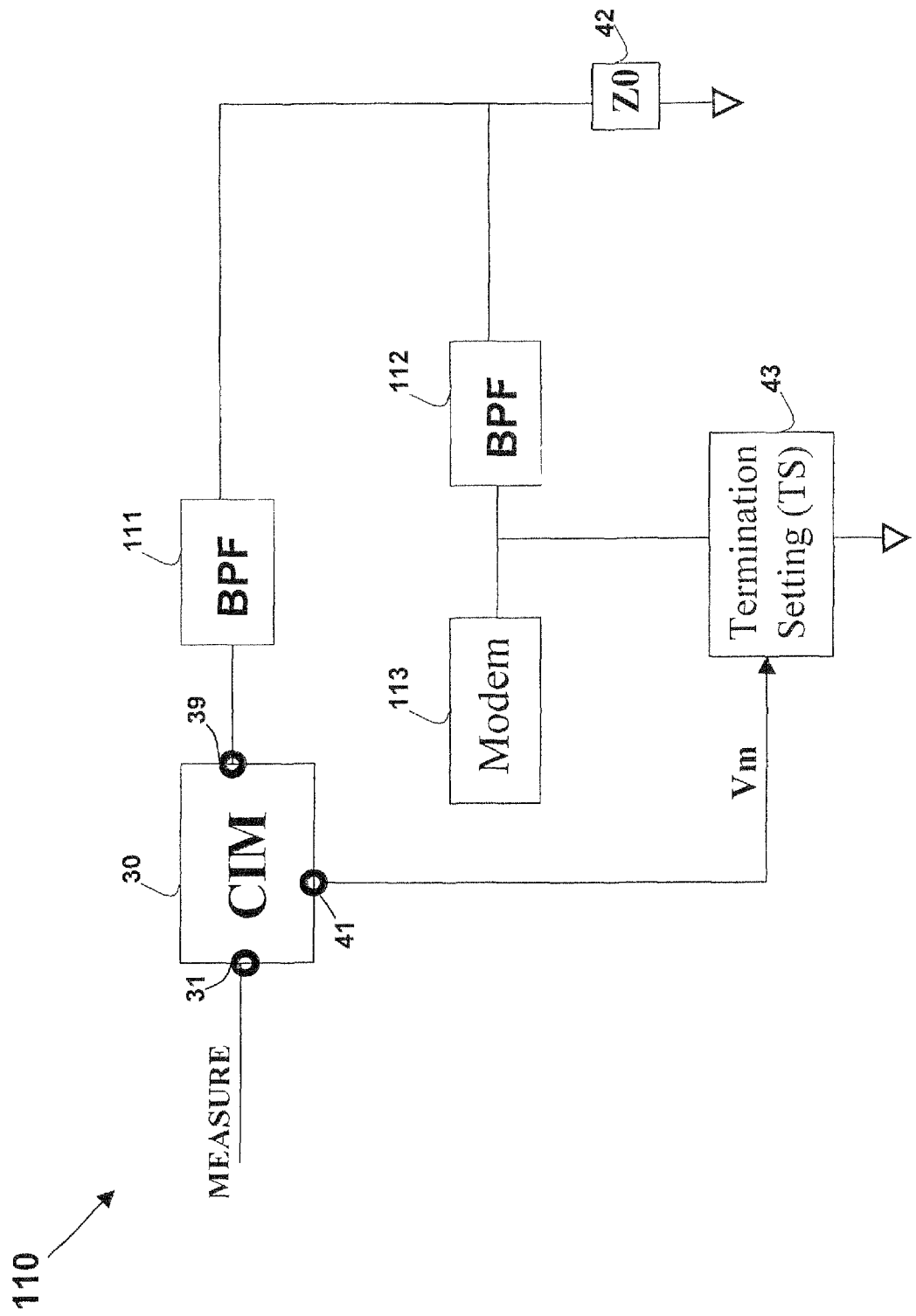
FIG. 11 illustrates schematically a general functional block diagram of an exemplary termination system according to the invention.

A system 110 utilizing the above FDM concept is shown in FIG. 11. The communication system is based on a modem 113 transmitting/receiving signals to/from the transmission line 42 through a Band Pass Filter (BPF) 112, passing only signals in the frequency band 103. The termination 43 is also connected to the transmission line 42 via the BPF 112. The automatic termination system is based on CIM 30, connected to the transmission line 42 via a Band Pass Filter (BPF) 111, passing only the termination system related signals residing in the band 102 (above frequency f2). In the frequency allocation 100 shown in FIG. 10, BPF 111 may be implemented as a High Pass Filter (HPF) and BPF 112 may be implemented as a Low Pass filter (LPF).

Working in different and non-overlapping frequency bands, both the communication and the automatic termination systems can concurrently operate, both coupled to the same transmission line. Since the termination value obtained by the automatic termination system (comprising the CIM 30 and the TS 43) relates to a frequency spectrum distinct from the frequency band used by the communication system, there may be a need to adjust the measured value in order to adapt from the measurement band to the communication band. Such adjustments may use known formulas, a pre-determined scaling or any other adaptation, extrapolation or approximation mechanisms.

While the above description involved the case wherein the automatic termination system used a frequency band above the communication system frequency band, other frequency band allocations may be used. For example, the termination system may use the frequency band 104 as part of the allocation 100, located below the communication system frequency band. In such a scenario, the BPF 112 may be implemented by an HPF (passing signals over frequency f1), and the BPF 111 may be implemented by a LPF passing signals under frequency f1.

Furthermore, the measurement system may use bands both below and above the communication system band. The measurements in the two bands may be performed simultaneously (e.g. by two independent CIMs), or be performed using a single CIM 30 and two distinct filters, each operative at a different time. Calculation of the termination value may use both measurements (low and high bands), such as interpolation based on the two readings (e.g. averaging).

Investigating Hidden Wirings

Figure 13:
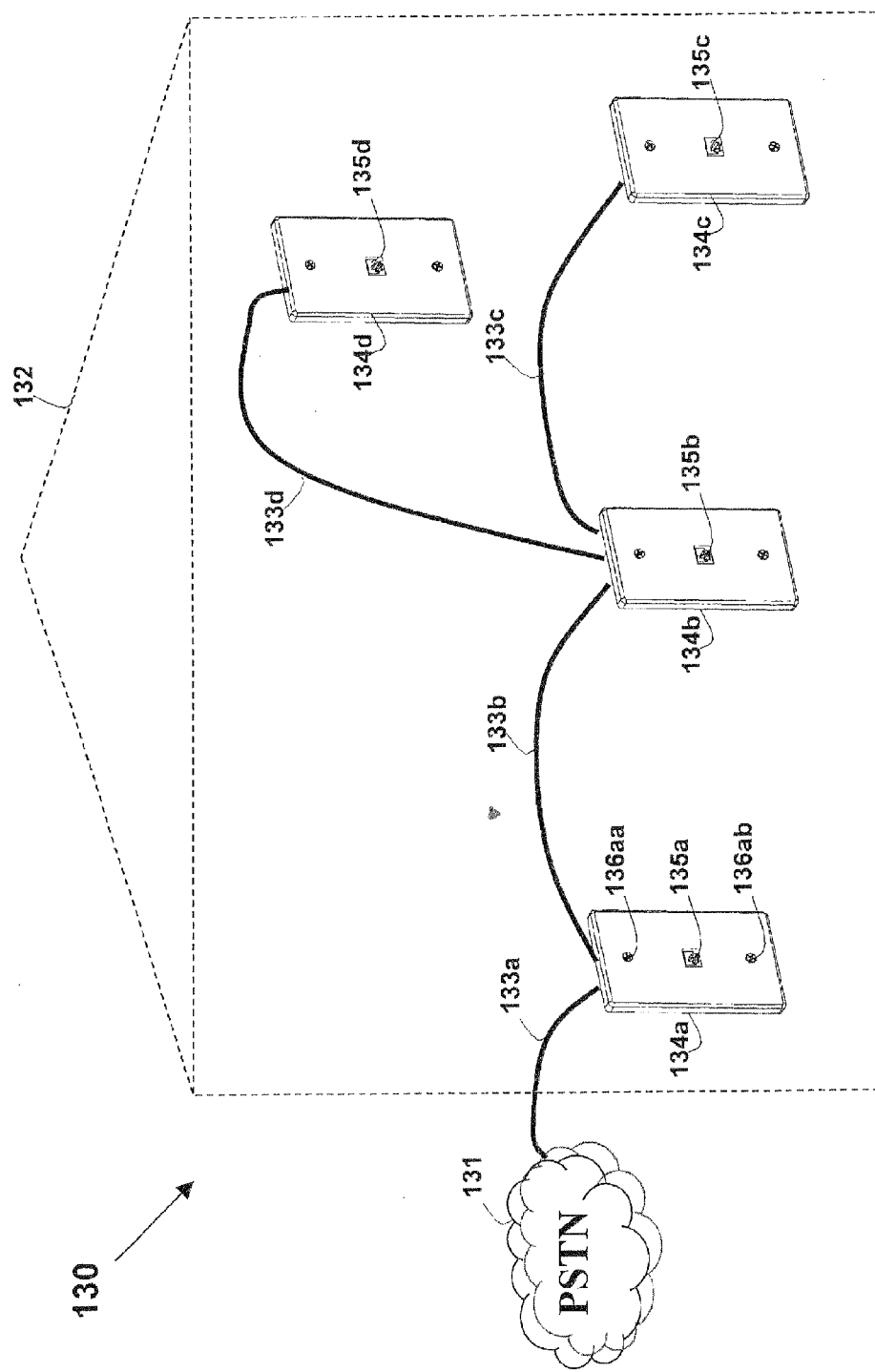
FIG. 13 illustrates schematically a telephone-wiring infrastructure in a house.

One application of the invention involves investigating an unknown and not-easily accessed wiring infrastructure. An existing telephone wiring in a building is one example. Such existing telephone wiring is hidden in the walls of a house, and a lot of effort is required to expose the topology of the wiring. An example of such existing telephone wiring structure is shown in FIG. 13 as system 130, involving telephone wiring infrastructure within the walls of a building 132. The in-house telephone wiring connects to the PSTN (Public Switching Telephone Network) 131 via one or more telephone wire pairs, commonly referred to as the 'local loop' or 'subscriber loop'. The telephone wiring is accessed in the house via telephone outlets 134a, 134b, 134c and 134d. Each such outlet 134 connects to the in wall wiring, and allows for connection thereto via a front connector 135 (commonly RJ-11 jack in North America), suitable for connection of a telephone set by a suitable plug (RJ-11 plug in North America). As shown for system 130, RJ-11 jacks 135a, 135b, 135c and 135d are respectively part of outlets 134a, 134b, 134c and 134d. In most cases, the telephone jack is part of a faceplate which is secured to an in-wall structure via screws 136aa and 136ab, corresponding screws not shown in the figure being applicable to all other outlets. Telephone wiring segment 133a connects the external local-loop (typically via an external connection box) to the outlet 134a. Telephone wiring 133b connects outlets 134a and 134b, and as such RJ-11 jack is actually a connection point for wiring segments 133a and 133b. Similarly, wiring segment 133c connects outlets 134b and 134c, and wiring segment 133d connects outlets 134b and 134d. Thus, outlet 134b serves as a connection point for the three segments 133b, 133c and 133d.

In many cases it is beneficial to explore the wiring topology in the house. For example, in the case wherein the telephone wiring is used for data communication (such as HomePNA mentioned above), knowing the topology enables installing proper terminations to the wires, hence reducing reflections and improving the communication characteristics. However, since the telephone wires are hidden in the walls of the house, there is no simple and direct way to know the wiring topology in the building. Dismantling the outlets from the walls to investigate the hidden wiring topology is cumbersome, time-consuming, expensive and will most likely require a professional worker (e.g. electrician, telephone technician). Using the CIM offers an easy and quick way of investigating the topology, using the pairs count method described above. For example, it is assumed that the telephone wire-pair characteristic impedance (in the bandwidth measured) is about 120 ohms. Connecting the CIM to outlet 134a (direct connection to RJ-11 jack 135a) will result in a measured impedance of 120/2=60 ohms, since the two wiring segments 133a and 133b are connected thereto. Similarly, connecting to jack 135b of outlet 134b will measure 120/3=40 ohms, due to the three connected segments 133b, 133d, and 133c. Similarly, outlets 134d and 134c will result in 120 ohms, since a single segment is connected thereto (120/1=120). Thus, the CIM can provide the data about the number of wiring segments connected to a specific outlet. In the above example, a set of measurements in all the house outlets will clearly indicate that only outlets 134d and 134c are connected to a single wiring segment, and as such are the only ones requiring termination.

In addition to topology finding, the CIM may also be used to measure the actual characteristic impedance of any hidden wiring segments, such as the in-wall telephone-wiring infrastructure 130. By connecting for example to the connector 135c of outlet 134c (known to be connected to a single wiring segment), the CIM can be used to measure the characteristic impedance of the wiring segment 133c connected thereto, thus allowing for adapting a proper termination value.

Figure 14:
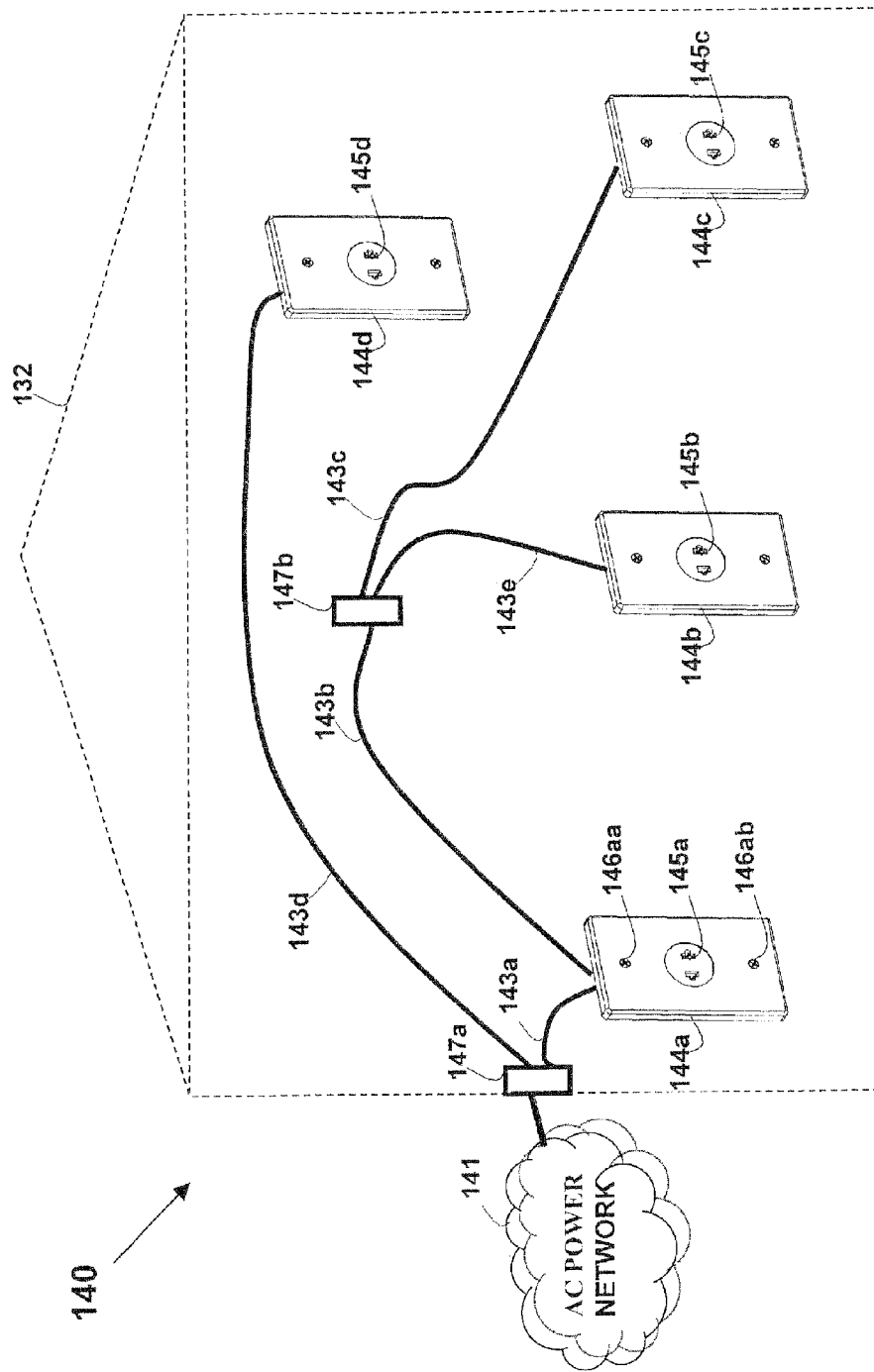
FIG. 14 illustrates schematically an AC-power wiring infrastructure in a house.

While the invention has been described with regard to telephone wiring, it will be appreciated that the same problem and benefits applies to electrical wiring within a building, used for distributing AC power in the house (115 VAC 60 Hz in North America and 220 VAC/50 Hz in Europe, for example). An example of such existing telephone wiring structure is shown in FIG. 14 as system 140, involving AC power wiring infrastructure within the walls of a building 132. The in-house AC power wiring connects to the external power distribution system 141 (typically via the nearest transformer) via a single (or more) AC power wire pair (typically third conductor is ground or earth potential) connected to a junction box 147a, serving as a 'demarcation-point'. The AC power wiring is accessed in the house via AC power outlets 144a, 144b, 144c and 144d. Each such outlet 144 connects to the in wall wiring, and allows for connection thereto via a front connector 145, commonly a receptacle/jack having two or three female connectors, suitable for connection of an appliance via respective prongs a suitable AC power plug. As shown for system 140, AC power jacks 145a, 145b, 145c and 145d are respectively part of outlets 144a, 144b, 144c and 144d. In most cases, the AC power receptacle is part of a faceplate which is secured to an in-wall structure via screws 146aa and 146ab, corresponding screws not shown in the figure being applicable to all other outlets as well. Unlike the telephone wiring structure shown as system 130 above, AC power wiring commonly uses junction boxes for multiple AC power wiring segment connections, such as junction box 147b. AC Power wiring segment 143a connects the junction box 147a to the outlet 144a. AC power wiring 143b connects outlet 144a and junction box 147b. Similarly, wiring segments 143c and 143e respectively connect outlets 144c and 144b to junction box 147b, and wiring segment 143d connects outlet 144d to junction box 147a. Thus, outlet 144a serves as a connection point for the two segments 143a and 143b. In a similar way to the above data communication over telephone wiring, such AC power wiring may be used for data communication concurrently with the AC power distribution functionality (e.g. using HomePlug standard). In such a system, the CIM can be used (by connecting to the relevant AC connector 145 of a tested outlet 144) to determine which AC power outlets are located at the end of a wire such as outlets 144b, 144c and 144d (and should be thus well terminated) and which outlets (such as outlet 144a) should not be terminated since it is not a communication end point. In addition, the CIM may be used to measure the characteristic impedance of an AC power segment thus enabling the installation of a proper termination wherever required.

While the invention has been demonstrated with regard to telephone and AC power wiring, it will be appreciated that the invention can equally be applied to any hidden wiring such as in-wall residential wiring, and specifically to CATV wiring. CATV wiring is used to distribute CATV and data signals throughout the house, and is based on coaxial-cable medium and CATV outlets having RF connectors such as BNC and F-Type. Likewise, the invention will find application where wiring is partially hidden and/or where it is routed in such manner (for example via several mutually adjacent rooms or floors) such that even if the wiring is visible, its topology is not readily discernible. Thus, the term "in-wall" when used in the description and appended claims encompasses also such applications.

In the above in-wall wiring applications for service wiring, comprising CATV, AC power or telephone wiring, the method 70 step 72 comprises connecting to the in-wall wiring, typically via the telephone connector 135 of the telephone outlet 134 in the telephone wiring application, or via the AC power connector 145 in the AC power outlet 144 in the AC power application, or via the RF connector that is part of a CATV outlet. Similarly, operation 77 involving CIM disconnecting comprises disconnecting from the connector in the outlet.

Housing/Packaging

Figure 15:
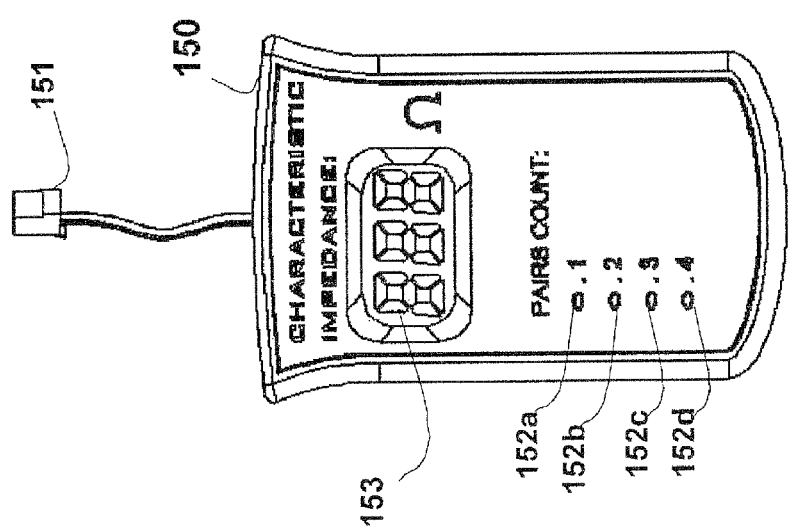
FIG. 15 illustrates schematically an exemplary termination test-set according to the invention.

The CIM 30 described above, with or without the termination setting mechanism shown a system 40, as well as system 80b, may be housed and/or integrated within an enclosure (in part of in full) as warranted by the application. In some embodiments, the CIM will be housed as a distinct, separately packaged and stand-alone device. Such an exemplary device 150 used as a handheld test-set device for testing the number of connected wiring segments and the characteristic impedance of a telephone wiring system in a residential house, as described above regarding wiring system 130, is shown in FIG. 15. The device 150 connects to the telephone outlet 134 RJ-11 jack connector 135 by a RJ-11 plug 151, and upon operation shows the measured characteristic impedance in ohms in the numeric display 153. Similarly, a pairs count may be measured as per the above described method, and the count of the pairs is displayed by light in the appropriate visual indicators (such as LEDs), wherein indicators 152a, 152b, 152c and 152d respectively represent 1, 2, 3 and 4 pairs counting.

In other embodiments, the CIM 30 (with or without a termination setting such as system 40), as well as system 80b, is not separated but rather integrated with the modem or transceiver used for data communication over the wiring or the transmission-line. In such a case, the housing comprising the modem will be also used to house the CIM and its related and associated components.

Figure 16:
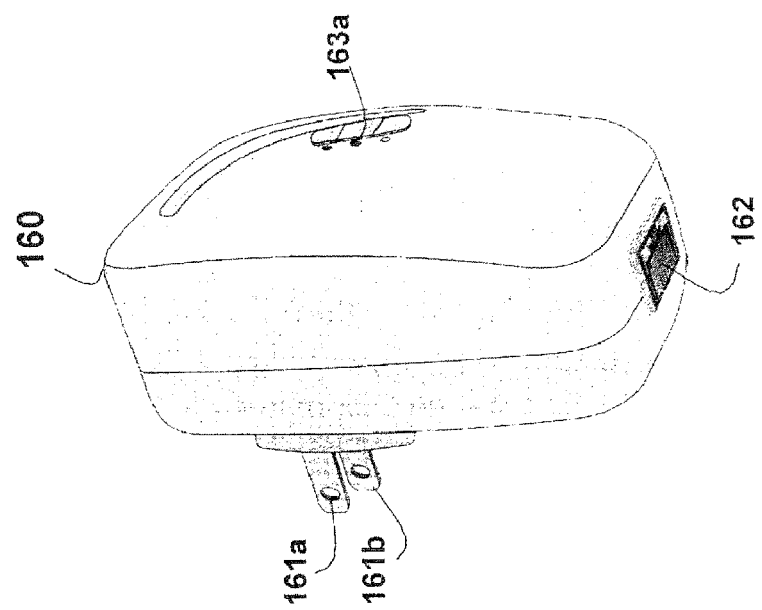
FIG. 16 illustrates schematically an exemplary AC power wiring termination device according to the invention.

Similar to the above discussion regarding housing of modems operative to carry data over active service wiring (to include telephone, AC power and CATV), the CIM related circuitry may be embedded (in part or in full) in an outlet (with or without a respective modem) or in a module mechanically and electrically attachable/detachable to a service outlet (to include telephone, AC power and CATV outlets). An example of such an outlet snap-on module for use with AC power outlet in North America is shown as module 160 in FIG. 16. The module 160 is mechanically attachable and electrically connectable to an AC power outlet 144 (as shown in FIG. 14) by two power prongs 161a and 161b, to be inserted into the respective female connectors of the AC power jack 145. Module 160 is shown to comprise a power-line modem (such as HomePlug based modem) allowing data units connected via IEEE802.3 10/100BaseT RJ-45 jack 162 to communicate over the AC power medium. Such module 160 typically comprises one or more visual indicators such as 163a shown, in order to report the system status to the user.

Operation Modes.

Various operating timing modes may be used involving characteristic impedance measuring.

Continuous mode: In such embodiment the characteristic impedance is continuously measured. Such operation is obtained by activating the 'Delay' 69 in the operational sequence 70. As such, upon completing a measurement sequence, the sequence re-starts from operation 72 or operation 74, causing another pulse to be transmitted and measured. In the case wherein no reflections are expected (e.g. long transmission line or well terminated line), the delay may be a minimum or even zero. In the case wherein reflections may occur, the delay should be calculated such that no reflections will be sensed upon the measuring operation 75. Similarly, continuous operation may use periodic operation, wherein the system is activated at fixed (or variable) intervals, based on the delay incurred in operation 69. In the case wherein the transmission line is also used for data communication, care should be taken that the pulse transmitted for the characteristic impedance measurement will not interfere with the data communication system operation. If the system is used solely for measurement (e.g. as test set) such as for pairs counting, such precautions are not required. It should be noted that measuring/setting termination value system 80b can also work continuously (or periodically), without affecting the data communication operation.

In continuous mode of operation, setting of termination value may also be continuous, wherein the set value tracks the continuous or periodic measured characteristic impedance, or alternatively may be set upon measuring a more than threshold change, or upon external control command.

One-time operation mode: In such embodiment the operational sequence 70 shown in FIG. 7 is operated once, and resumes its non-operational state after sequence completion. In such mode, the need for operation 69 is obviated. The 'start' operation 71 initializing the process may be operated automatically or upon external control (outside the CIM unit) request. In one embodiment, initialization of the measurement is initiated upon powering up the unit. In another embodiment, the modem may initiate measuring (and setting of the termination value) at every communication session initialization. In yet another embodiment, the system will commence operation upon manual request (e.g. button push)

by a user. Similarly applying for system 80*b*, the loop operation will be allowed only once for a short period, and the set value will be locked afterwards.

Figures 17, 18:
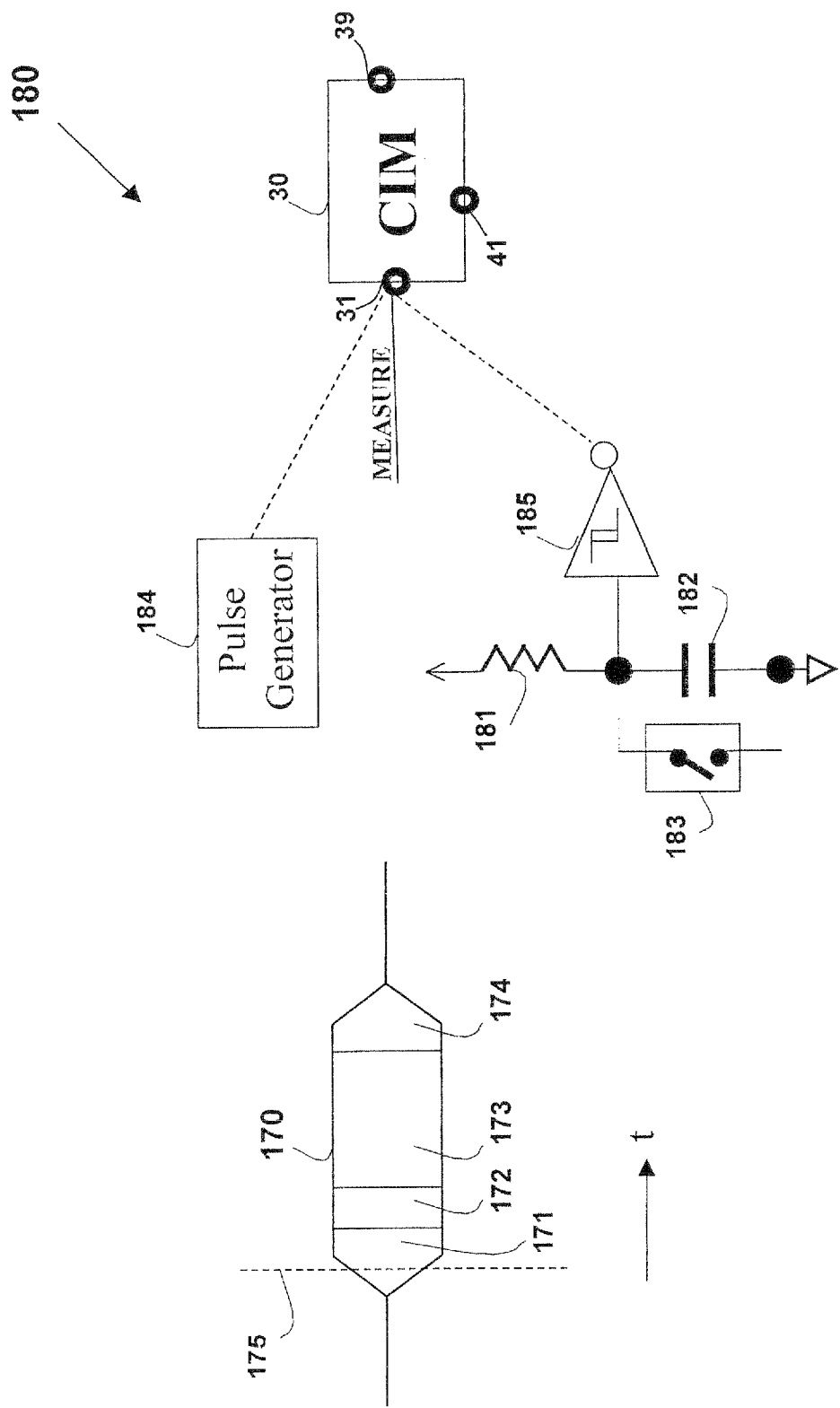
FIG. 17 illustrates schematically a typical packet structure.
FIG. 18 illustrates schematically a general functional block diagram of an exemplary termination system according to the invention.

Packet-based operation: While the invention has been demonstrated with regard to CIM 30 generating a specific dedicated pulse only for the purpose of the characteristic impedance measurement, it will be appreciated that the invention can equally be applied to the case wherein the energy used for the measurement is part of a modem regular data communication operation. Particularly, in packet- or burst-based communication, wherein a transmitter is not continuously transmitting but rather intermittently, the packet transmitted can serve also for the purpose of measuring the characteristic impedance. Typically packets used in the art, such as IEEE802.3, comprise four parts (commonly referred to as fields), illustrated as packet 170 as shown in FIG. 17. The first transmitted part is a preamble 171, used for synchronization and receiver training, followed by a header field 172 comprising overhead and management information such as an address. The actual data 173 is next transmitted, followed by a trailer field 174 (comprising checksum, for example). Soon after the packet start, the measurement can be executed, based on the energy transmitted as part of the preamble, for example, as shown in timing line 175. In such a configuration, a measurement may be performed based on the packets timing. For example, operation may be initiated upon each packet sent or every multiple packet set.

Setting of termination value, if required, may also be continuous, one-time or packet-based. In each case, the set value may track the continuous, periodic or one-time measured characteristic impedance, or alternatively may be set upon measuring a more than threshold change, or upon external control command.

An example of implementation guidelines is shown as system 180 in FIG. 18. A CIM 30 is shown, wherein operation is initiated by coupling a pulse to input 31 ('Measure'). A pulse generator 184, such as based on the 555 family of integrated circuit timers known in the art, may be connected to the 'measure' port 31, repetitively and periodically sending pulses to the CIM 30, implementing a continuous and/or periodic mode of operation. Alternatively, there is provided a power-up circuit comprising a resistor 181, a capacitor 182 and an inverting gate 185 (preferably having Schmitt-trigger function) such as 74HC14. Before power-up, capacitor 182 is discharged. Upon powering the circuit, capacitor 182 is charged, causing the gate 185 output to generate a short 'Measure' pulse, thus initiating a onetime operation upon each system powering-up. Furthermore, manual initiation may be added by connecting a switch button 183 in parallel to the capacitor 182. Upon switch 183 contacts closing, the capacitor is discharged and a 'Measure' pulse is regenerated.

While the invention has been demonstrated with various operation modes such as continuous, periodic, manually, one-time and per-packet operations, it will be appreciated that the invention can equally be applied to any combination of the above modes. For example, a system may be initiated upon power-on and then periodically or communication session-timed. Furthermore, the system may shift from mode to mode during operation upon external control.

For many applications involving digital data communication, the characteristic impedance of a line may be practically regarded as having a pure resistance. While the invention has been demonstrated above relating to a pure-resistance based termination, it will be appreciated that the invention can equally be applied to any type of termination, including a termination comprising a complex impedance, using the embodiment of FIG. 5, for example. Furthermore, both linear and non-linear terminations may be considered. Furthermore, while the invention has been demonstrated above relating to matching a termination value to the characteristic impedance of a line in order to reduce reflections, it will be appreciated that the invention can equally be applied to any application wherein a matching termination is not deployed. In these applications, the measured characteristic impedance value may be used as a basis to the termination value to install, thus enabling the control of the mismatch and the level of generated reflections, instead of trying to eliminate them altogether. For example, slight mis-match may be used in digital data transmission in order to improve the rise/fall time of the signal.

While the invention has been demonstrated above relating to a parallel termination wherein the termination device is directly connected to the two conductors comprising the wired transmission-line, it will be appreciated that the invention can equally be applied to any type of termination arrangement or topology, such as serial (a.k.a. back-matching), power and bi-directional, as described in National Semiconductor Corporation Application Note 903 (August 1993) entitled: "A Comparison of Differential Termination Techniques". Furthermore, the invention can be applied in both balanced and unbalanced lines, as well as in both lossy and lossless lines.

While the invention has been demonstrated above relating to a digital data communication comprising electrical signals propagating over wired transmission-line, it will be appreciated that the invention can equally be applied to any type of electrical signal, including analog signals.

While the invention has been described with regard to a metallic transmission-line comprising two conductors and carrying electrical signals, it will be appreciated that the invention can equally be applied to any type of transmission-line, including any electric wave transmission systems wherein electromagnetic wave energy is guided or constrained by a wave transmission guide. Such wave transmission lines include passive or active wave transmission networks simulating the characteristics of a long line wave transmission systems or wave guides, such as artificial lines, delay networks, resonators, impedance matching networks, equalizers, loaded lines and wave filters.

While the invention has been described with regard to a termination consisting of a single passive element (e.g. resistor), it will be appreciated that the invention can equally be applied to any type of termination arrangement, including passive or active elements, including impedance matching networks, hybrid networks, coupling networks, wave shaping networks, phase shifting networks, wave filters, equalizers and attenuators. Active elements include devices for producing across at least two of the system terminals a negative resistance, and/or an inductance, or capacitance, wherein each of the above may be positive or negative.

While the invention has been described in terms of preferred embodiments and generally associated methods, the inventor contemplates that alterations and permutations of the preferred embodiments and methods will become apparent to those skilled in the art upon a reading of the specification and a study of the drawings.

Accordingly, neither the above description of preferred exemplary embodiments nor the abstract defines or constrains the invention. Rather, the issued claims variously define the invention. Each variation of the invention is limited only by the recited limitations of its respective claim, and equivalents thereof, without limitation by other terms not present in the claim. In addition, aspects of the invention are particularly pointed out in the claims using terminology that the inventor regards as having its broadest reasonable interpretation; more specific interpretations of 35 U.S.C. section.112 (6) are only intended in those instances where the term "means" is actually recited. The words "comprising," "including," and "having" are intended as open-ended terminology, with the same meaning as if the phrase "at least" were appended after each instance thereof.

What is claimed is:

1. A method for matching a termination to a wired transmission-line using a closed-control loop, the transmission-line being connected to carry a signal and having a nominal characteristic impedance, the method comprising:
   connecting a termination having a controllable impedance value to the transmission-line;
   measuring the power dissipated by the termination by conductive connection to the impedance to measure at least two of: the voltage across the termination; the current through the termination; and the impedance of the termination; and
   changing the termination impedance value to obtain a maximum power dissipation by the termination in response to the measurement of the power dissipated.

2. The method according to claim 1, further comprising storing a representation of the termination value.

3. The method according to claim 1, wherein said measuring comprises conductively measuring at least one of: the voltage across the termination; and the current through the termination.

4. A device for matching a termination to a wired transmission line using a closed-control loop, the transmission-line being connected to carry a signal and having a nominal characteristic impedance, said device comprising:
   a port for connecting to the wired transmission line,
   a termination having a variable impedance value coupled to said port and having a control port,
   means conductively connected to said termination for measuring the power dissipated by said termination by directly measuring at least two of: the voltage across said termination; the current through said termination; and the impedance of said termination, and
   control means coupled between said means for measuring and said control port for closed loop control operative for changing the impedance value of said termination to maximize power dissipated in said termination when power is supplied to the transmission line.

5. The device according to claim 4, further comprising a memory for storing a representation of the termination impedance value.

6. The device according to claim 4, wherein power dissipated in said termination is conductively measured by measuring at least one of: the voltages across said termination; and the current through said termination.

7. A method for estimating an optimum impedance value for a termination to a wired transmission line having a characteristic impedance Z0 comprising:
   connecting a characteristic impedance measuring device to the wired transmission line,
   instantaneously measuring the characteristic impedance Z0, and estimating an optimum termination value based on the measured value Z0.

8. The method according to claim 7, further comprising storing a representation of the measured characteristic impedance value.

9. The method according to claim 7, wherein the estimated value is equal to the measured value Z0.

10. The method according to claim 7, further comprising connecting a termination having the estimated value to the wired transmission line.

11. The method according to claim 7, wherein the wired transmission line comprises a wire pair at least partially hidden in the wall of a building and connected to an outlet having a front faceplate, and said connecting a characteristic impedance measuring device to the wired transmission line comprises connecting the device to a connector on the front faceplate of the outlet.

12. The method according to claim 11, wherein the wire pair is part of a telephone, AC power, or CATV wiring infrastructure, and said outlet is a telephone, AC power, or CATV outlet, respectively.

13. The method according to claim 12, wherein the infrastructure carries a signal in a first frequency band and said step of measuring comprises transmitting energy to the transmission line, the energy being in a second frequency band distinct from the first frequency band.

14. The method according to claim 7, wherein the wired transmission line comprises wire pairs at least partially hidden in the wall of a building, at least one of the wire pairs is connected to an outlet, and said method comprises the preliminary operation of integrating the measuring device into the outlet.

15. The method according to claim 7 for use with a modem for communication over the wired transmission line, wherein the wired transmission line comprises wire pairs, and said method further comprises: initiating said measuring operation by disconnecting the modem from the wired transmission line; and re-connecting the modem to the transmission-line after said measuring operation.

16. The method according to claim 7, wherein said measuring and estimating operations are initiated periodically, or upon application of an external signal, or upon powering up of the measuring device.

17. A method for matching a termination to a wired transmission-line using a closed-control loop, the transmission-line being connected to carry a signal and having a nominal characteristic impedance, the method comprising:
   connecting a termination having a controllable impedance value to the transmission-line;
   measuring the power dissipated by the termination by non-conductive coupling to the termination; and
   changing the termination impedance value to obtain a maximum power dissipation by the termination in response to the measurement of power dissipated.

18. The method according to claim 17, further comprising storing a representation of the changed termination impedance value.

19. The method according to claim 17, wherein said measuring comprises non-conductively measuring the dissipated power by measuring a physical phenomenon affected by the dissipated power.

20. A device for matching a termination to a wired transmission line using a closed-control loop, the transmission-line being connected to carry a signal and having a nominal characteristic impedance, said device comprising:

a port for connecting to the wired transmission line,
a termination having a variable impedance value coupled to said port and having a control port,
means non-conductively connected to the termination for measuring power dissipated by said termination, and
control means coupled between said means for measuring and said control port for closed loop control and for changing the impedance value of said termination to maximize power dissipated in said termination when power is supplied to the transmission line.

21. The device according to claim 20, further comprising a memory for storing a representation of the changed termination impedance value.

22. The device according to claim 20, wherein power dissipated in said termination is non-conductively measured by measuring a physical phenomenon affected by the dissipated power.

* * * * *

UNITED STATES PATENT AND TRADEMARK OFFICE
CERTIFICATE OF CORRECTION

| | | |
|---|---|---|
| PATENT NO. | : 8,391,470 B2 | Page 1 of 1 |
| APPLICATION NO. | : 12/141600 | |
| DATED | : March 5, 2013 | |
| INVENTOR(S) | : Hazani et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 915 days.

Signed and Sealed this
Eleventh Day of November, 2014

Michelle K. Lee
*Deputy Director of the United States Patent and Trademark Office*